(12) United States Patent
Burr

(10) Patent No.: US 6,586,817 B1
(45) Date of Patent: Jul. 1, 2003

(54) DEVICE INCLUDING A RESISTIVE PATH TO INTRODUCE AN EQUIVALENT RC CIRCUIT

(75) Inventor: James B. Burr, Foster City, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/860,253

(22) Filed: May 18, 2001

(51) Int. Cl.[7] ............................................. H01L 29/00
(52) U.S. Cl. ..................... 257/536; 257/345; 257/402; 257/537; 257/538; 257/539
(58) Field of Search ............................. 257/536, 537, 257/538, 539, 345, 402

(56) References Cited

U.S. PATENT DOCUMENTS

| | | | |
|---|---|---|---|
| 4,365,172 A | 12/1982 | Prater | 307/270 |
| 4,700,212 A | 10/1987 | Okazawa | 357/41 |
| 4,735,914 A | 4/1988 | Hendrickson et al. | 437/44 |
| 4,974,059 A | 11/1990 | Kinzer | 357/23.4 |
| 5,270,565 A | 12/1993 | Lee et al. | 257/358 |
| 5,352,915 A | 10/1994 | Hutchings et al. | 257/361 |
| 5,362,981 A | 11/1994 | Sato et al. | 257/371 |
| 5,471,421 A | 11/1995 | Rose et al. | 365/182 |
| 5,489,795 A | 2/1996 | Yoshimura et al. | 257/369 |
| 5,566,120 A | 10/1996 | D'Souza | 365/227 |
| 5,581,500 A | 12/1996 | D'Souza | 365/154 |
| 5,594,371 A | 1/1997 | Douseki | 326/119 |
| 5,602,407 A | 2/1997 | Washkurak et al. | 257/223 |
| 5,606,270 A | 2/1997 | D'Souza et al. | 326/98 |
| 5,612,645 A | 3/1997 | Halepete | 327/537 |
| 5,622,880 A | 4/1997 | Burr et al. | 438/194 |
| 5,623,154 A | 4/1997 | Murakami et al. | 257/345 |
| 5,640,115 A | 6/1997 | Halepete et al. | 327/219 |
| 5,650,340 A | 7/1997 | Burr et al. | 437/30 |
| 5,675,172 A | 10/1997 | Miyamoto et al. | 257/402 |
| 5,719,422 A | 2/1998 | Burr et al. | 257/336 |
| 5,726,477 A | 3/1998 | Williams et al. | 257/402 |
| 5,751,170 A | 5/1998 | Pyeon | 327/57 |
| 5,753,958 A | 5/1998 | Burr et al. | 257/392 |
| 5,773,863 A | 6/1998 | Burr et al. | 257/344 |
| 5,780,912 A | 7/1998 | Burr et al. | 257/408 |
| 5,783,958 A | 7/1998 | Lysinger | 327/202 |
| 5,811,871 A | 9/1998 | Nakashima | 257/565 |
| 5,916,237 A | 6/1999 | Schu | 607/2 |
| 5,923,987 A | 7/1999 | Burr | 438/304 |
| 5,942,781 A | 8/1999 | Burr et al. | 257/347 |
| 5,982,211 A | 11/1999 | Ko | 327/202 |
| 5,985,705 A | 11/1999 | Seliskar | 438/197 |
| 5,985,727 A | 11/1999 | Burr | 438/302 |
| 5,998,850 A | 12/1999 | Burr | 257/428 |
| 6,031,778 A | 2/2000 | Makino et al. | 365/226 |
| 6,048,746 A | 4/2000 | Burr | 438/17 |
| 6,071,768 A | 6/2000 | Duvvury et al. | 438/234 |
| 6,072,217 A | 6/2000 | Burr | 257/351 |
| 6,087,892 A | 7/2000 | Burr | 327/534 |
| 6,091,283 A | 7/2000 | Murgula et al. | 327/537 |
| 6,093,951 A | 7/2000 | Burr | 257/408 |
| 6,100,567 A | 8/2000 | Burr | 257/365 |

(List continued on next page.)

*Primary Examiner*—Richard Elms
*Assistant Examiner*—Douglas Menz
(74) *Attorney, Agent, or Firm*—Gunnison, McKay & Hodgson, L.L.P.; Philip J. McKay

(57) ABSTRACT

Structures for providing devices that include resistive paths specifically designed to provide a predetermined resistance between the bulk material of the device and a well tie contact. By providing a resistive path, an equivalent RC circuit is introduced to the device that allows the bulk material potential to track the gate potential, thereby advantageously lowering the threshold voltage as the device turns on and raising the threshold voltage as the device turns off. In addition, the introduction of the resistive path also allows the bulk material potential to be controlled and stabilize at an equilibrium potential between switching events.

7 Claims, 17 Drawing Sheets

U.S. PATENT DOCUMENTS

| | | | |
|---|---|---|---|
| 6,110,783 A | 8/2000 | Burr | 438/286 |
| 6,118,328 A | 9/2000 | Morikawa | 327/534 |
| 6,121,666 A | 9/2000 | Burr | 257/408 |
| 6,133,762 A | 10/2000 | Hill et al. | 326/119 |
| 6,137,142 A | 10/2000 | Burr | 257/349 |
| 6,144,079 A | 11/2000 | Shirahata et al. | 257/392 |
| 6,190,954 B1 | 2/2001 | Lee et al. | 438/199 |
| 6,211,003 B1 * | 4/2001 | Taniguchi et al. | 438/228 |
| 6,211,725 B1 | 4/2001 | Kang | 327/534 |
| 6,231,147 B1 | 5/2001 | Bosshart | 327/212 |
| 6,255,853 B1 | 7/2001 | Houston | 326/98 |
| 6,310,487 B1 | 10/2001 | Yokomizo | 324/769 |
| 6,329,874 B1 | 12/2001 | Ye et al. | 327/544 |
| 6,348,372 B1 * | 2/2002 | Burr | 438/223 |
| 6,406,955 B1 * | 6/2002 | Kim et al. | 438/199 |
| 6,414,360 B1 | 7/2002 | Gardner | 257/369 |

* cited by examiner

DEVICE INCLUDING A RESISTIVE PATH TO INTRODUCE AN EQUIVALENT RC CIRCUIT

FIELD OF THE INVENTION

The present invention relates generally to transistor devices and, more particularly, to low power and ultra-low power MOS devices.

BACKGROUND OF THE INVENTION

In modern computer systems, power density and scalability issues represent some of the most significant obstacles to increased system performance. For reliability, the supply voltage Vdd must come down and the threshold voltage must come up. Consequently, performance is being rapidly squeezed between the two. In addition, with the emergence of an electronics market that stresses portability, compact size, lightweight and the capability for prolonged remote operation, a demand has arisen for low power and ultra-low power transistor devices and systems. To meet this demand devices are emerging which have extremely low threshold voltages.

There are a number of factors that contribute to the magnitude of a device's threshold voltage. For example, to set a device's threshold voltage near zero, light doping and/or counter doping in the channel region of the device may be provided. However, due to processing variations, the exact dopant concentration in the channel region can vary slightly from device to device. Although these variations may be slight, they can shift a device's threshold voltage by a few tens or even hundreds of millivolts. Further, dimensional variations, such as oxide thickness, channel width, channel length, charge trapping in materials and interfaces, and environmental factors, such as operating temperature fluctuations, can shift the threshold voltage.

Lowering the threshold voltage of a device typically decreases active power dissipation by permitting the same performance to be achieved at a lower supply voltage. However, lowering the threshold voltage of a device normally increases standby power dissipation by increasing device leakage and devices having low threshold voltages can leak so much current when their circuits are in a sleep or standby mode that the gains made by lowering the threshold voltage are outweighed by the power lost to leakage.

Consequently, it is particularly desirable in low-threshold devices to provide a mechanism for tuning the threshold voltage to account for these and other variations. Tuning the threshold voltage of a device can be accomplished using back biasing, i.e. controlling the potential between a device's well and source. See James B. Burr, "Stanford Ultra-Low Power CMOS," Symposium Record, Hot Chips V, pp. 7.4.1–7.4.12, Stanford, Calif. 1993, which is incorporated, in its entirety, herein by reference. Back-biasing is used to electrically tune the transistor thresholds by reverse biasing the bulk of each MOS transistor, relative to the source, to adjust the threshold potentials. Typically, the potential will be controlled through isolated contacts to the source and well regions together with circuitry necessary for independently controlling the potential of these two regions.

FIG. 1A illustrates a prior art device 100A in which each of an NFET 101 and a PFET 102 essentially constitutes a four-terminal device. NFET 101 is made up of an N-region source 103, a gate electrode 104, an N-region drain 105, and a P-bulk material 106. Similarly, PFET 102 includes P-region source 108, a gate electrode 109 and a P-region drain 110 formed in an N-well 111. The device of FIG. 1A also includes a P plug that forms a well tie 112 for P-bulk material 106, and an N plug that forms a well tie 113 for N-well 111.

In the back-biased CMOS design of FIG. 1A, well tie 112 of bulk material 106 is electrically isolated from source 103 of NFET 101 by providing a separate metallic rail contact 116 which is spaced from metallic rail contact 114 of source 103. Rail contact 116 is coupled to a bias voltage source Vpw. Likewise, well contact 113 of N-well 111 is split off from source 108 of PFET 102 by providing a separate metallic rail contact 118 that is electrically isolated from metallic rail contact 115 of source 108. Rail contact 118 is coupled to a bias voltage source Vnw.

According to the structure of prior art device 100A, the substrate bias potential of NFET 101 is set by Vpw, and that of PFET 102 is set by Vnw. In other designs, a number of transistors are formed in a common well. In these designs, the bias potential may be routed within a surface well.

FIG. 1B illustrates a device 100B similar to device 100A of FIG. 1A, except that bulk material 106 of the NFET 101 in FIG. 1B is biased to Vpw by way of a metallic back plane 119, rather than by way of well tie 116 as shown in FIG. 1A.

FIG. 1C shows a portion of prior art back biased device 100A including NFET 101. In the discussion below, NFET 101 was chosen for illustrative purposes only. Those of skill in the art will recognize that PFET 102 could also have been chosen and that the discussion and effects discussed below would be equally applicable, with the exception that the polarities would be reversed.

In FIG. 1C, the well-known effect of coupling capacitance between gate 104 and bulk material 106 is represented by gate-bulk coupling capacitance 150 and the well known effects of coupling capacitance between drain 105 and bulk material 106 is represented by drain-bulk coupling capacitance 152. Due to gate-bulk coupling capacitance 150, there is a tendency for the voltage of bulk material 106, V-bulk, to track the voltage on gate 104. As discussed in more detail below, if this tracking were allowed, there is a tendency to raise V-bulk and decrease the threshold voltage of NFET 101 as device 101 turns on, and, as discussed above, lowering the threshold voltage of a device such as NFET 101 has several benefits. However, in the prior art, a significant amount of effort, and virtually all teaching, was directed to keeping V-bulk constant during a switching event and preventing significant changes in the potential of bulk material 106 during a switching event. To this end, it was taught that bulk material 106 should be the lowest resistance possible and that bulk material 106 should be coupled as directly as possible to ground or some other drain-off potential.

The main reason that the prior art taught keeping V-bulk constant, and bulk material 106 as low a resistive value as possible, is that in prior art CMOS designs two problems were always being dealt with: large impact ionization currents and/or latch up.

Impact ionization currents are created because the potentials in standard CMOS devices are high, on the order of 1.5 to 5.0 volts. At these potentials, charge carriers acquire so much kinetic energy that the impact of the carriers at the drain end of the channel can result in the generation of electron-hole pairs. Typically, in an NFET, the electrons move across the channel to the drain while the holes move into bulk material 106 thus creating potentially large sub-currents in bulk material 106. In the prior art, if bulk material 106 were composed of even moderately resistive material, these sub-currents would result in large voltage drops throughout bulk material 106.

FIG. 1D shows a graph of the natural log of the substrate current in an N-well (Inw) and P-well (Ipw) due to impact ionization as a function of the source to drain potential (Vds) of a device. It is worth noting for later reference that at a Vds of 1.0 volts (120) or less, there is virtually no impact ionization current, while at the typical prior art CMOS Vds of 1.5 (123) to 5.0 (125) volts the impact ionization current is relatively high.

In addition to minimizing the effects of impact ionization current, the prior art taught that bulk material 106 must be low resistance, and kept at a constant potential, to avoid latch-up. Latch-up is a well-known result of CMOS design that inherently includes parasitic bipolar transistors cross-coupled in the device. As a result of these parasitic bipolar transistors, if the potential of bulk material (Vpw) 106 becomes sufficiently large and forward biased, or if the n-well potential (Vnw) of n-well 111 (see FIG. 1A) becomes sufficiently lower than the supply voltage (Vdd), a short is created between ground (gnd) and supply voltage (Vdd). This short could draw enough current to not only shut down or "latch-up" the device, but in many cases, the current draw was large enough to physically destroy the device. Latch-up typically occurs in devices with supply voltages of 0.8 volts or greater. Note that in some cases, latch-up could be prevented even if the supply voltage is greater than 0.8V using back bias. A back biased bulk is much less likely to rise sufficiently above ground to turn on the parasitic NPN; likewise, a back biased N-well is much less likely to decrease sufficiently below Vdd to turn on the PNP.

Both impact ionization current and latch-up are well known to those of skill in the art. As a result of these known effects, prior art CMOS devices, and the entire teaching in the prior art, was directed to devices which minimize these effects by having low resistance bulk materials 106 and keeping the bulk potential, V-bulk, as constant as possible.

FIG. 1E shows the relationship between: the gate potential 160 (Vg 160) of gate 104 (FIG. 1C); the drain potential 170 (Vd 170) of drain 105; and the bulk potential 180 (V-bulk 180) in a device designed according to the prior art CMOS structures and teachings.

In FIG. 1E, at time T0: Vg 160 is at potential 161, typically near a digital zero; Vd 170 is at potential 171, typically near a digital one; and V-bulk 180 is at equilibrium potential 181, in one embodiment ground. In time interval 191, i.e., between T1 and T2, the device turns on and: Vg 160 rises along ramp 163 from potential 161, typically near digital zero, to potential 165, typically near digital one; at the same time, due to gate-bulk coupling capacitance 150, V-bulk 180 increases slightly from equilibrium potential 181, typically ground, to potential 183, typically greater than ground, but significantly less than digital one. In one embodiment, potential 183 is 10 to 100 millivolts greater than equilibrium potential 181.

During this same time frame, i.e., time interval 191, Vd 170 remains relatively constant at near digital one. From time T2 on, Vg 160 also remains relatively constant at near digital one. However, since the device being discussed is designed according to prior teachings to have a low resistance bulk material 106, at time T2, V-bulk 180 rapidly drops back to potential 181, the equilibrium potential. In one embodiment, V-bulk 180 drops back to equilibrium potential 181 in 10 to 100 pico-seconds, a small fraction of time interval 191.

In time interval 193, i.e., between time T3 and T4, the device is on and the drain potential is decreasing. Consequently, Vd 170 starts to fall from potential 171, typically near digital one, to potential 175, typically near digital zero, along ramp 173. Also in time interval 193, due to drain-bulk coupling capacitance 152, V-bulk 180 drops from equilibrium potential 181, typically ground, to a lower potential 187 along ramp 185 which tracks ramp 173. In one embodiment, potential 187 is 10 to 100 millivolts less than equilibrium potential 181.

During this same time frame, i.e., time interval 193, Vg 160 typically remains relatively constant at near digital one. From time T4 on, Vd 170 also remains relatively constant at near digital zero. However, since the device being discussed is designed according to prior art teachings to have a low resistance bulk material 106, at time T4, V-bulk 180 rapidly rises back to equilibrium potential 181. In one embodiment, V-bulk rises back to equilibrium potential 181 in 10 to 100 pico-seconds, a small fraction of time interval 193.

Note, in FIG. 1E, time interval 191 is shown graphically spaced from time interval 193, however those of skill in the art will recognize that in many cases time interval 191 will overlap with time interval 193 creating a more complex wave form. Consequently, the representation in FIG. 1E has been simplified for illustrative purposes.

A similar, but reversed, process takes place when the device turns off, i.e., when Vg 160 goes back to a digital zero and Vd 170 goes back to a digital one. Consequently, in prior art CMOS devices, and according to prior art teachings, V-bulk 180 remains relatively constant in response to a single switching event. As a result, the threshold voltages of prior art devices such as NFET 101, PFET 102 and prior art back biased devices 100A and 100B remain relatively constant in response to a given switching event. Therefore, while being very stable, prior art CMOS devices do not benefit from lower threshold voltages as the device turns on or relatively higher threshold voltages as the device turns off.

In contrast to prior art CMOS devices, such as NFET 101 and PFET 102 discussed above, with their relatively constant bulk material potential during a switching event and correspondingly constant threshold voltages, Partially Depleted Silicon On Insulator (PDSOI) devices have floating bulk potentials. Silicon-On-Insulator (SOI) devices are characterized by structures in which the silicon device layers are formed over an insulating film. FIG. 2A illustrates an exemplary configuration of such a device 200A. Device 200A of FIG. 2A includes an NFET 201 and a PFET 202 formed within a layer 236. Layer 236 is located along an oxide layer 208 which itself is formed atop a P+ bulk material 220. NFET 201 includes source and drain N-regions 203 and 205, respectively, a P-type channel 216 and a gate electrode 204. PFET 202 includes source and drain P-regions 208 and 210, respectively, an N-type channel 224 and a gate electrode 209. SOI devices, such as SOI device 200A, are characterized by low parasitic capacitances, as well as high dielectric isolation of the on-chip components.

A "partially depleted" SOI device refers to a structure in which the depletion region of the transistor does not extend all the way down to oxide layer 208. An example of this type of structure is shown in FIG. 2B. FIG. 2B shows a portion of a prior art partially depleted SOI NFET device 201B. In the discussion below, NFET 201B was chosen for illustrative purposes only. Those of skill in the art will recognize that a PFET device could also have been chosen and that the discussion and effects discussed below would be equally applicable, with the exception that the polarities would be reversed.

In FIG. 2B, the silicon layer 236B is relatively thick and the N-regions 203B and 205B are appropriately configured, typically through use of source-drain extensions, such that depletion region 228 is spaced from the upper surface of oxide layer 208B by a distance 230, i.e., only a portion of the P-region 216B is depleted. Consequently, when the gate potential is turned on, the potential of P-region 216B, below the depletion region 228, i.e., the "bulk region 206B" is pulled up, whereby the bulk material potential, V-bulk, of bulk material region 206B tracks the gate potential. This results in a forward biasing of the bulk region 206B that in turn decreases the threshold voltage of device 201B.

In FIG. 2C, the well-known effect of coupling capacitance between gate 204B and bulk material region 206B is represented by gate-bulk coupling capacitance 250 and the well known effects of coupling capacitance between drain 205B and bulk material region 206B is represented by drain-bulk coupling capacitance 252. Due to gate-bulk coupling capacitance 250, there is a tendency for the voltage of bulk material region 206B, V-bulk, to track the voltage on gate 204B.

FIG. 2D illustrates the well known floating body effect by showing the relationship between: the gate potential 260 (Vg 260) of gate 204B (FIG. 2B); the drain potential 270 (Vd 270) of drain 205B; and the bulk potential 280 (V-bulk 280) in a device such as partially depleted SOI device 201B designed according to the prior art structures and teachings.

In FIG. 2D, at time T0: Vg 260 is at potential 261, typically near a digital zero; Vd 270 is at potential 271, typically near a digital one; and V-bulk 280 is at potential 281. In time interval 291, i.e., between T1 and T2: Vg 260 rises along ramp 263 from potential 261, typically near digital zero, to potential 265, typically near digital one. At the same time, due to gate-bulk coupling capacitance 250, V-bulk 280 tracks Vg 260 and increases from equilibrium potential 281 to potential 283, typically greater than 281, and, in one embodiment, as high as a digital one greater than 281.

During this same time frame, i.e., time interval 291, Vd 270 remains relatively constant at near digital one. From time T2 to time T3, Vg 260 and V-bulk 280 remain relatively constant at their respective values 265 and 283.

In time interval 293, i.e., between time T3 and T4, Vd 270 starts to fall from potential 271, typically near digital one, to potential 275, typically near digital zero, along ramp 273. Also in time interval 293, due to drain-bulk coupling capacitance 252, V-bulk 280 partially tracks Vd 270 and drops from potential 283 to a lower potential 287, which, in one embodiment, is as much as a digital one below 283, along ramp 285, which tracks ramp 273. During this same time frame, i.e., time interval 293, Vg 260 typically remains relatively constant at near digital one. From time T4 on, Vd 270 remains at near digital zero.

Note, in FIG. 2D, time interval 291 is shown graphically spaced from time interval 293, however those of skill in the art will recognize that in many cases time interval 291 will overlap with time interval 293 creating a more complex wave form. Consequently, the representation in FIG. 2D has been simplified for illustrative purposes.

Importantly, from time T4 on, V-bulk 280 remains relatively constant at potential 287, which, in FIG. 2D, is a higher potential than the equilibrium potential 281. Note, however, that in other instances, it is possible that potential 287 will be lower than potential 281, depending on the relative magnitude of coupling capacitances 250 and 252. Consequently, V-bulk 280 typically does not return to its equilibrium potential 281 before the next clock and becomes unpredictable with each successive clock period. This is the essence of the floating body effect discussed above.

A similar, but reversed, process takes place as the device turns off, i.e., when Vg 260 goes back to a digital zero and Vd 270 goes back to a digital one. However, each period results in continued variation in the starting potential of V-bulk 280. Consequently, in prior art SOI devices, the benefits of V-bulk 280 tracking the gate potential Vg 260, i.e., lowering the threshold voltage as the device turns on and raising the threshold voltage as the device turns off, are outweighed by the uncertainty of V-bulk 280, i.e., the floating body effect.

As discussed above, lowering the threshold voltage during switching of a device, such as NFET 201B, has several benefits including higher performance and/or lowering overall power consumption. However, in SOI devices, such as devices 200A and 201B, and, in particular, partially depleted SOI devices such as device 201B, when the bulk material potential, V-bulk 280, of bulk material region 206B tracks the gate, the bulk material potential, V-bulk 280, of bulk region 206B becomes an uncontrollable and unpredictable variable. Consequently, in contrast to standard CMOS devices discussed above, in PDSOI devices, the potential V-bulk cannot be known with any certainty, i.e., it floats. Therefore, the threshold voltage of the device can vary from clock to clock and period to period.

As discussed above, in prior art CMOS devices, it is taught that the bulk material, including any wells in the bulk material, should be as low resistance as possible and V-bulk should remain as relatively constant as possible to deal with large impact ionization currents and latch-up. Consequently, prior art CMOS structures could not benefit from a variable V-bulk which tracks the gate potential and thereby lowers the threshold voltage as the device turns on.

As also discussed above, while prior art partially depleted SOI devices did allow the potential of the bulk material, V-bulk, to track the gate potential and thereby lower the threshold voltage as the device turned on, the floating body effect meant that the device typically did not return to an equilibrium potential between clock periods. Therefore, neither V-bulk, nor the threshold voltage of the device, could be controlled or predicted.

What is needed is a device whose threshold voltage lowers as the device turns on and then rises as the device turns off, like a partially depleted SOI device, yet has the equilibrium stability of prior art CMOS devices so that V-bulk returns to a relatively known value within one clock period. Consequently, what is needed is a device that allows the bulk material potential to track the gate potential to lower the threshold voltage as the device turns on and raise the threshold voltage as the device turns off, yet allows the bulk material potential to be controlled and stabilize at an equilibrium potential between clock periods.

SUMMARY OF THE INVENTION

In one embodiment of the invention, a device is provided on a semiconductor substrate, the device includes: a bulk material of a first conductivity type; source and drain regions of a second conductivity type, positioned within the bulk material and separated by a channel region; a gate positioned over the channel region; and a resistive well of the first conductivity type positioned in the bulk material below the channel region. A first location in the resistive well is electrically coupled to the bulk material. The resistive well has an average dopant concentration of the first conductivity type that is specifically chosen to provide a resistance per unit length of the resistive well within a desired range.

In one embodiment of the invention, the device also includes a well tie of the first conductivity type positioned within the bulk material. The well tie is positioned beside one of either the source or drain regions and outside the channel region. The well tie is electrically coupled to a second location in the resistive well. In one embodiment of the invention, the first position in the resistive well and the second position in the resistive well are separated by a horizontal distance. In one embodiment of the invention, the well tie is coupled to a first supply voltage and the source is coupled to a second supply voltage.

In one embodiment of the invention, the device is a low power device characterized as having an on current and an off current, and the ratio of on current to off current in the device is not greater than about $10^5$. In one embodiment of the invention, the device has an unbiased threshold voltage of between about −150 millivolts and +150 millivolts.

In contrast to the structures and teachings of the prior art, the present invention includes a structure for providing at least one low power MOS device that includes a resistive well specifically designed to provide a resistive path between the bulk material of the device and a well tie contact. By providing a resistive path as taught by the invention, an equivalent RC circuit is introduced to the device that allows the bulk material potential to track the gate potential during switching, thereby lowering the threshold voltage as the device turns on and raising the threshold voltage as the device turns off. This gives devices designed according to the invention the positive attributes of prior art partially depleted SOI devices. However, the introduction of the resistive path, in accordance with the invention, also allows the bulk material potential to be controlled and stabilized at an equilibrium potential between clock periods. Therefore, devices designed according to the principles of the invention do not suffer from the floating body effect associated with prior art partially depleted SOI devices.

In addition, the devices according to one embodiment of the invention are designed to be used in a low-power or ultra-low power environment. Consequently, in contrast to prior art CMOS devices, the present invention can include resistive wells without fear of voltage drops across the bulk material that are associated with large impact ionization currents and/or latch-up and device self-destruct.

One embodiment of a device designed according to the principles of the invention includes a bulk material of a first conductivity type with source and drain regions positioned within the bulk material and separated by a channel region, the source and drain regions having a second conductivity type. A gate is positioned over the channel region.

The device also includes a resistive path in the bulk material, the resistive path being positioned in the bulk material so as to couple a first location in the bulk material, below the channel region, to a second location in the bulk material, the resistive path having a horizontal length. According to the principles of the invention, the horizontal length of the resistive path is chosen to provide a resistance between the first location and the second location within a specific range of resistance values.

Another embodiment of a device designed according to the principles of the invention includes a substrate having a first dopant concentration of a first conductivity type and an epitaxial layer formed on the substrate, the epitaxial layer having a second dopant concentration of the first conductivity type.

Source and drain regions are positioned within the epitaxial layer and separated by a channel region, the source and drain regions having a second conductivity type. A gate is positioned over the channel region.

According to the invention, a resistive path is positioned in the epitaxial layer and the substrate so as to couple a first location in the epitaxial layer, below the channel region, to a second location in the epitaxial layer, the resistive path having a horizontal length in the substrate. The horizontal length of the resistive path is chosen to provide a resistance between the first location and the second location in the epitaxial layer within a specific range of resistance values.

In one embodiment of the invention, the first dopant concentration is greater than the second dopant concentration.

Another embodiment of a device designed according to the principles of the invention includes a substrate of a first conductivity type and a surface well having a first dopant concentration of a second conductivity type formed in the substrate.

Source and drain regions are positioned within the surface well and separated by a channel region, the source and drain regions having the first conductivity type. A gate is positioned over the channel region.

One embodiment includes a buried well having a second dopant concentration of the second conductivity type, the buried well being positioned in the substrate, below the surface well.

In this embodiment, a resistive path is positioned so as to couple a first location in the surface well, below the channel region, to a second location in the surface well, the resistive path having a horizontal length in the buried well. The horizontal length of the resistive path in the buried well is chosen to provide a resistance between the first location and the second location in the surface well within a specific range of resistance values.

In one embodiment, the first dopant concentration is less than the second dopant-concentration.

Another embodiment of a device designed according to the principles of the invention includes a substrate having a first dopant concentration of a first conductivity type and a layer formed on the substrate, the layer having a second dopant concentration of the first conductivity type.

Source and drain regions are positioned within the layer and separated by a channel region, the source and drain regions having a second conductivity type. A gate is positioned over the channel region.

This embodiment also includes a buried well having a second dopant concentration of the second conductivity type, the buried well being positioned between the substrate and the layer, the buried well having a perforation.

According to this embodiment of the invention, a resistive path is positioned in the layer and the substrate so as to couple a first location in the layer, below the channel region, to a second location in the layer, the resistive path having a horizontal length in the substrate that is coupled to the first and second locations in the layer through the perforation in the buried well. The horizontal length of the resistive path in the substrate is chosen to provide a resistance between the first location and the second location in the layer within a specific range of resistance values.

A structure according to the principles of the invention includes: a substrate having a first dopant concentration of a first conductivity type; a layer formed on the substrate, the layer having a second dopant concentration of the first conductivity type; and a surface well having a first dopant concentration of a second conductivity type formed in the layer.

A first transistor having source and drain regions separated by a channel region is positioned within the layer, the source and drain regions having a second conductivity type. A gate is positioned over the channel region.

A second transistor having source and drain regions separated by a channel region is positioned within the surface well, the source and drain regions having the first conductivity type. A gate is positioned over the channel region.

The structure includes a buried well having a second dopant concentration of the second conductivity type, the buried well being positioned between the substrate and the layer, the buried well having a perforation.

A first resistive path is positioned in the layer and the substrate so as to couple a first location in the layer, below the channel region of the first transistor, to a second location in the layer, the first resistive path having a horizontal length in the substrate that is coupled to the first and second locations in the layer through the perforation in the buried well. The horizontal length of the first resistive path in the substrate is chosen to provide a resistance between the first location and the second location in the layer within a specific range of resistance values.

A second resistive path is positioned so as to couple a first location in the surface well, below the channel region of the second transistor, to a second location in the surface well, the second resistive path having a horizontal length in the buried well. The horizontal length of the second resistive path in the buried well is chosen to provide a resistance between the first location and the second location in the surface well within a specific range of resistance values.

In some embodiments of the invention the devices are characterized as having an on current and an off current and the ratio of on current to off current in the device is not greater than about $10^5$. In addition, some devices of the invention have an unbiased threshold voltage of between about −150 millivolts and +150 millivolts.

As a result of these and other features discussed in more detail below, devices designed according to the principles of the present invention have the desirable attributes of both prior art CMOS devices and prior art PDSOI devices, without the drawbacks of either of these prior art devices.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

Figure 3A:
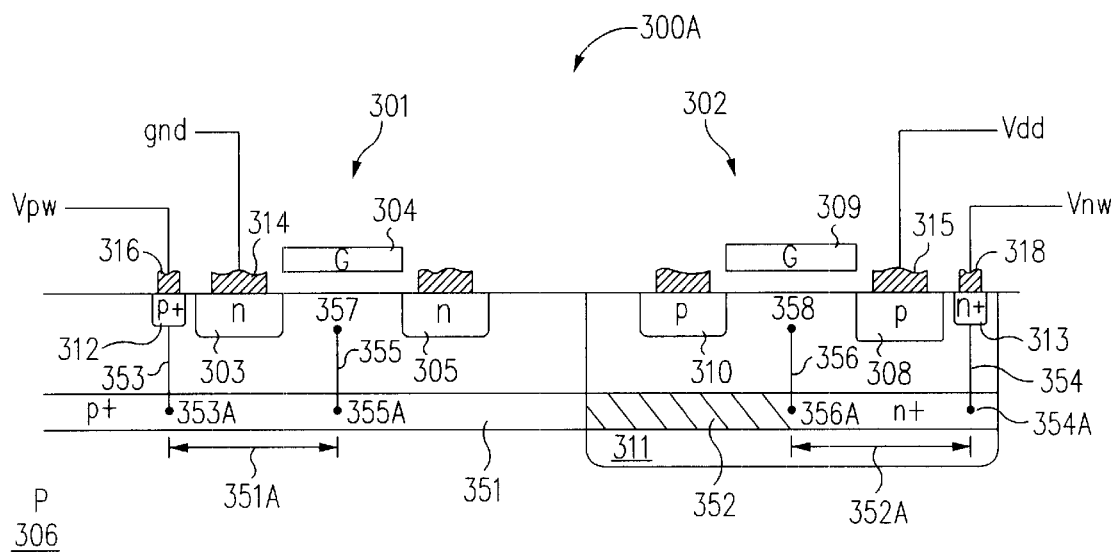
FIG. 3A shows one embodiment of a device in accordance with the principles of the present invention.

FIG. 3A illustrates a resistive well device 300A according to one embodiment of the invention. Device 300A includes an NFET 301 and a PFET 302 each of which is essentially a four-terminal device. NFET 301 is made up of an N-region source 303, a gate electrode 304, an N-region drain 305, formed in p-bulk material 306. Similarly, PFET 302 includes P-region source 308, a gate electrode 309 and a P-region drain 310 formed in an N-well bulk material 311. The device of FIG. 3A also includes a P plug that forms a well tie 312 and an N plug that forms a well tie 313.

In resistive well device 300A, according to one embodiment of the invention, well tie 312 is electrically isolated from source terminal 303 of the NFET 301 by providing a separate metallic rail contact 316 which is spaced from the metallic rail contact 314 of source 303. Rail contact 316 is coupled to a bias voltage source Vpw. Likewise, well contact 313 is split off from source 308 of PFET 302 by providing a separate metallic rail contact 318 that is electrically isolated from metallic rail contact 315 of source 308. Rail contact 318 is coupled to a bias voltage source Vnw.

According to the invention, resistive well device 300A also includes resistive wells 351 and 352. According to one embodiment of the invention, resistive well 351 is a P-type well. In one embodiment of the invention, resistive well 351 is doped with P-type dopant atoms to provide the desired resistance level as discussed below. According to one embodiment of the invention, resistive well 352 is an N-type well. In one embodiment of the invention, resistive well 352 is doped with N-type dopant atoms to provide the desired resistance level, as also discussed below.

According to one embodiment of the invention, the P+ plug that forms well tie 312 is electrically coupled to point 353A in resistive well 351 through path 353 and point 357 in bulk material 306, below the channel of NFET 301, is electrically coupled to point 355A in resistive well 351 through path 355. A horizontal distance 351A separates point 353A from point 355A. According to the invention, the value of distance 351A is predetermined to provide a resistance within a desired range, as discussed in more detail below.

Similarly, according to one embodiment of the invention, the N+ plug that forms well tie 313 is electrically coupled to point 354A in resistive well 352 through path 354 and point 358 in N-well bulk material 311, below the channel of PFET 302, is electrically coupled to point 356A in resistive well 352 through path 356. A horizontal distance 352A separates point 354A from point 356A. According to the invention, the value of distance 352A is predetermined to provide a resistance within a desired range, as also discussed in more detail below.

In one embodiment of the invention, resistive wells 351 and 352, according to the invention, are created by dopant implantation methods well know to those of skill in the art. The concentration and depth of implantation will vary from application to application. In particular, the resistivity of the well can be engineered by modifying its geometry (length, width, and thickness) as well as the dopant concentration laterally along its length. As discussed in more detail below, the goal is to compensate for the distance from a device to the nearest well contact, and according to the simultaneous switching activity in the vicinity of the device to achieve a well resistivity that restores the device's well potential to equilibrium before it switches again. Thus, according to the invention, the dopant concentration and well dimensions are varied to adjust the resulting resistance per unit length of resistive wells 351 and 352. In one embodiment of the invention, the P-type dopant concentration in P-type resistive well 351 is in the approximate range of $1 \times e^{14}$ to $1 \times e^{17}$ per $cm^3$ and the thickness of resistive well 351 is approximately 0.1 micrometer to yield a resistance of approximately 10 kilo-ohms to 10 mega-ohm per square.

In one embodiment of the invention the N-type dopant concentration in N-type resistive well 352 is in the approximate range of $1 \times e^{16}$ to $1 \times e^{18}$ per $cm^3$ and the thickness of resistive well 352 is approximately 0.1 micrometer to yield a resistance of approximately 100 ohms to 100 kilo-ohms per square.

Those of skill in the art will note that N-well 352 layer is much less resistive than P-well 351 in this example and recognize that in an N-well technology, it is easier to shape the N-well/buried N-well path to optimize its resistivity than it is to shape the P-well path, since the entire P-substrate is P-type.

Also, according to the invention, it is not necessary for the resistivity to be uniform within the well, just that it lie within bounds that both enable a transient floating body effect during turn-on and a return to an equilibrium potential before the next time the gate switches.

In another embodiment of the invention, resistive wells 351 and 352 are formed by implanting surface profiles to form the wells, then forming a surface layer of silicon (not shown) either through epitaxial growth or amorphous deposition followed by solid phase epitaxy to crystallize the surface layer. This method has the advantage that it avoids a potential problem implanting wells resulting from the increased dopant concentration in the surface tail of a deep implant.

As discussed above, the dopant concentration in resistive wells 351 and 352 can be varied to yield a desired resistance. In addition, the overall resistance between points 353A and 355A, in resistive well 351, and points 354A and 356A, in resistive well 352, can be varied by increasing or decreasing the horizontal distances 351A and 352A in resistive wells 351 and 352, respectively. Therefore, a higher resistance can be achieved by increasing the value of 351A and 352A, or a lower resistance can be achieved by decreasing the value of 351A and 352A.

The specific examples given above are for illustrative purposes only. Those of skill in the art will readily recognize that virtually any resistance per unit length, and overall resistance, can be achieved and that different applications and devices will benefit from different resistances.

Figure 1A:
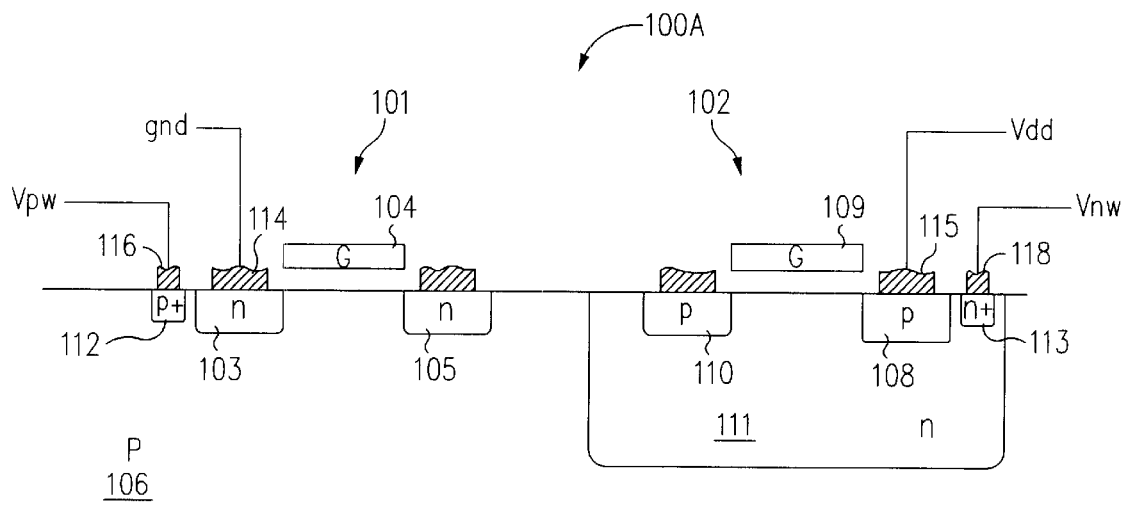
FIG. 1A shows a prior art CMOS device in which each of an NFET and a PFET essentially constitute a four-terminal device.
Figure 1B:
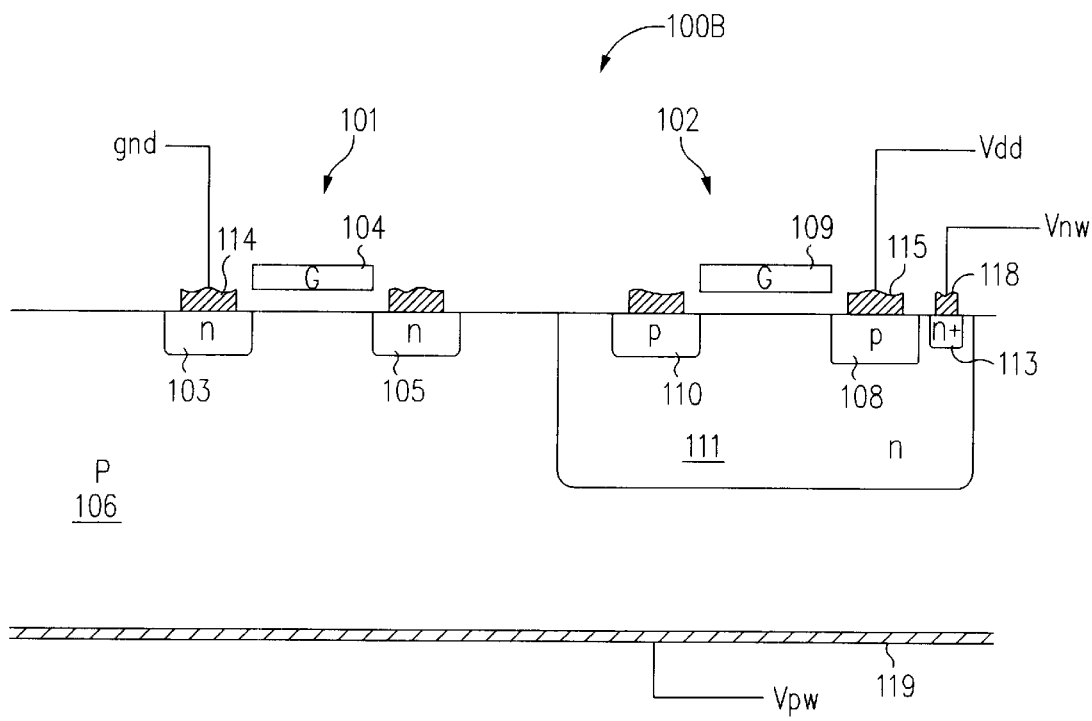
FIG. 1B shows a prior art device similar to the device of FIG. 1A, except that the substrate or bulk material of the NFET in FIG. 1B is biased by way of a metallic back plane, rather than by way of a well tie.
Figure 1C:
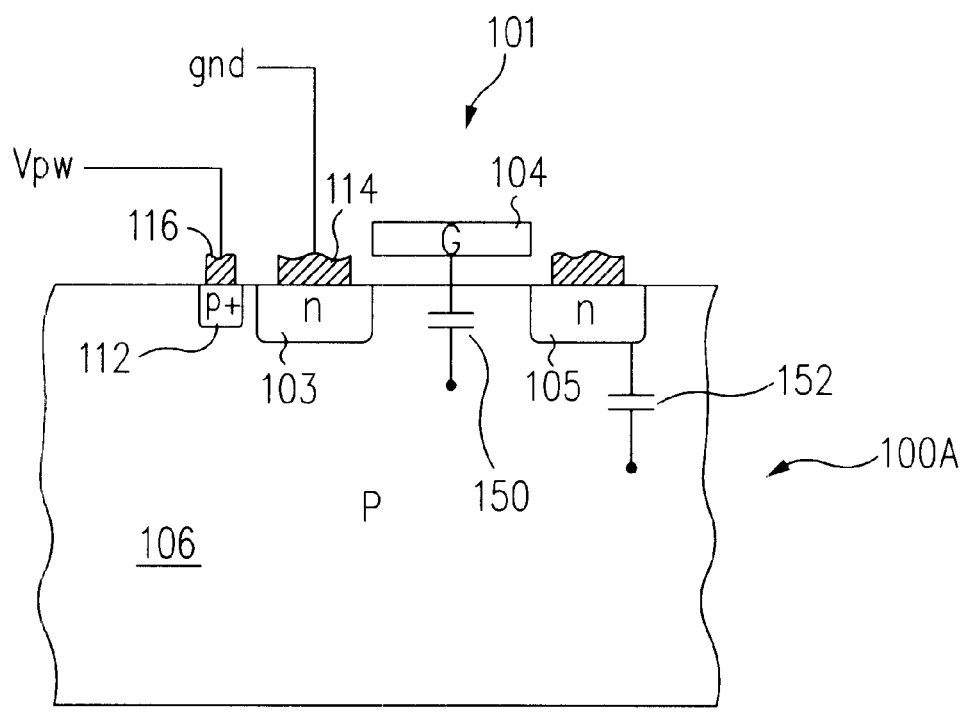
FIG. 1C shows a portion of a prior art back biased device, including an NFET, and the well-known effect of coupling capacitance between the gate and the bulk material region and the well known effect of coupling capacitance between the drain and the bulk material region in prior art CMOS devices.
Figure 1D:
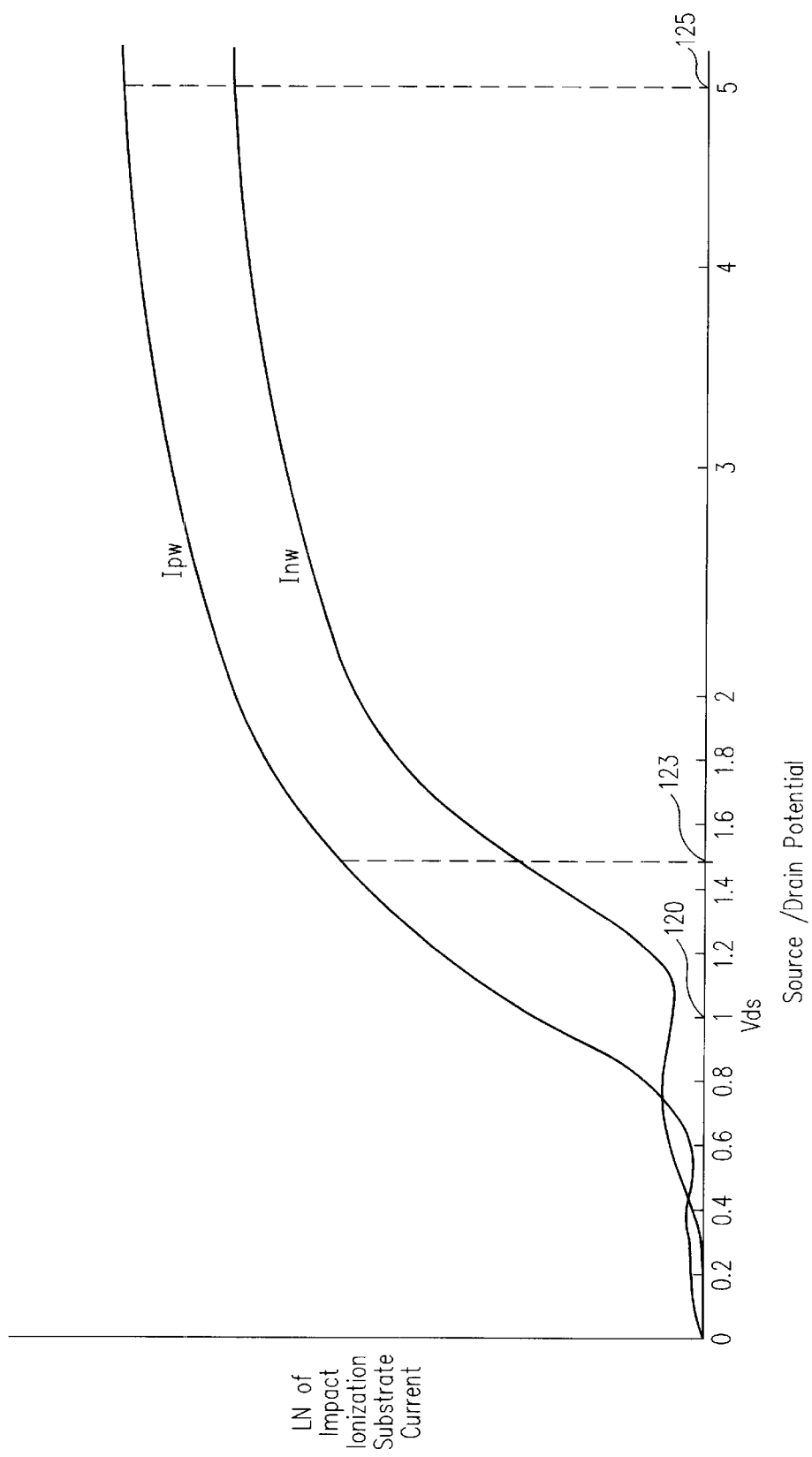
FIG. 1D shows a graph of the natural log of the substrate current due to impact ionization as a function of the source to drain potential of a device.

As discussed above, in the prior art CMOS devices it was specifically taught that providing a resistive path between well tie 312 and point 357 in bulk material 306, or between well tie 313 and point 358 in N-well bulk material 311, was to be avoided. As also discussed above, this teaching was adopted in light of the dual dangers of voltage drops due to large impact ionization currents and/or latch-up. However, as also discussed above, at source/drain (Vds) voltages of less than one volt, impact ionization currents drop off to insignificant levels (see FIG. 1D) and latch-up can be avoided by operating at supply voltages of less than 0.8 volt.

In addition, standard CMOS devices such as NFET 101 (FIG. 1C) require higher threshold voltages and higher threshold voltages require a higher well dopant concentration, which also tends to lower well resistivity in the vicinity of the channel. Consequently, while it is possible to engineer a resistive well in standard CMOS, it is easier in low power or ultra-low power CMOS, because the thresholds are lower and the well resistivity is naturally higher.

Figure 3B:
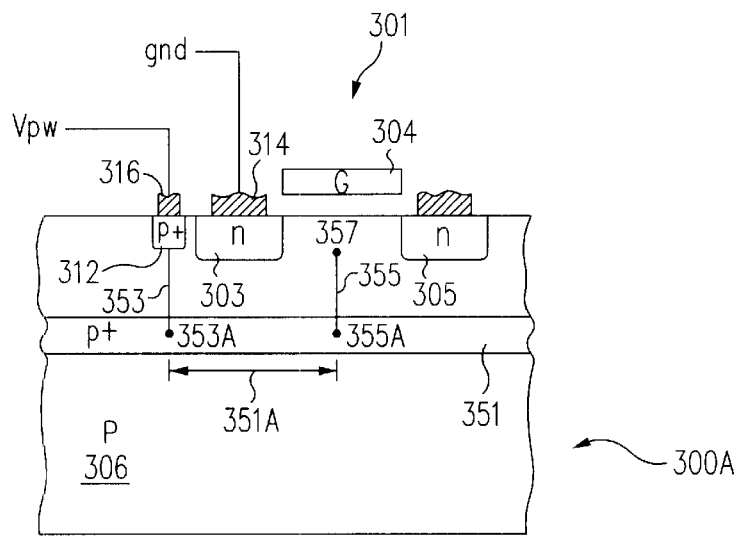
FIG. 3B shows a portion of the device of FIG. 3A, including an NFET in more detail, in accordance with the principles of the present invention.
Figure 3C:
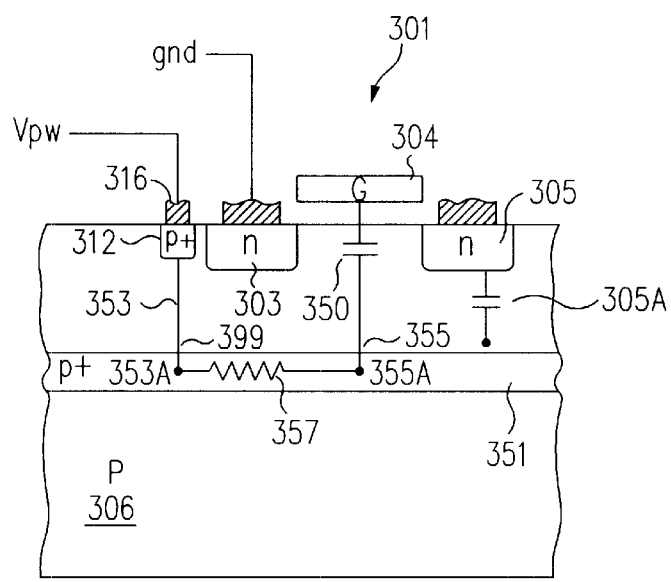
FIG. 3C shows the equivalent RC circuit in the device of FIG. 3B, formed by the coupling capacitance between the gate and the bulk material and the resistance of the resistive well, in accordance with the principles of the present invention.

In one embodiment of the invention, the structures of FIGS. 3A, 3B and 3C are low-power or ultra-low power devices where the source/drain (Vds) voltages, and the supply voltages, are significantly below 0.8 volt. In one embodiment of the invention, the supply voltage operates between 0.2 volt and 0.6 volt, depending on the operating conditions resulting in source/drain voltages between 0.2 volt and 0.6 volt.

By employing the structure of FIG. 3A in a low-power or ultra-low power environment, the present invention can be utilized without fear of large impact ionization currents, and the associated voltage drops across the bulk materials 306 and 311, and without fear of latch-up or device self destruct, as was the fear in the prior art.

FIG. 3B shows a portion of device 300A of FIG. 3A including NFET 301 in more detail. In the discussion below, NFET 301 was chosen for illustrative purposes only. Those of skill in the art will recognize that PFET 302 could also have been chosen and that the discussion and effects discussed below would be equally applicable, with the exception that the polarities would be reversed.

FIG. 3B shows NFET 301 including: N-region source 303; gate electrode 304; N-region drain 305; P-bulk material 306; well tie 312, that is electrically coupled to point 353A in resistive well 351 through path 353; and point 357 in bulk material 306, that is electrically coupled to point 355A in resistive well 351 through path 355. Horizontal distance 351A separating point 353A from point 355A is also shown.

In FIG. 3C, the well-known effect of coupling capacitance between gate 304 and bulk material 306 is represented by gate-bulk coupling capacitance 350 and the well known effect of coupling capacitance between drain 305 and bulk material 306 is represented by drain-bulk coupling capacitance 305A. In addition, the resistance of resistive well 351, between points 353A and 355A, according to the invention, is represented by equivalent resistor 357. Consequently, an equivalent RC circuit 399 is formed between well tie 312 and gate 304 using the structure of the invention.

Series RC circuits, such as equivalent RC circuit 399, and their behavior are well known in the art. If it is assumed that gate-bulk coupling capacitance 350 is uncharged when a potential is applied to gate 304, then the initial potential across gate-bulk coupling capacitance 350 is zero and the voltage difference between gate 304 and well tie 312 is dropped across equivalent resistor 357, i.e., between points 353A and 355A of resistive well 351. As gate-bulk coupling capacitance 350 charges, the voltage across gate-bulk coupling capacitance 350 increases and the voltage across equivalent resistance 357 decreases. After a long enough time passes, i.e., in steady state, all the voltage difference between gate 304 and well tie 312 is dropped across gate-bulk coupling capacitance 350 and the voltage drop across equivalent resistance 357 is zero.

Figure 3D:
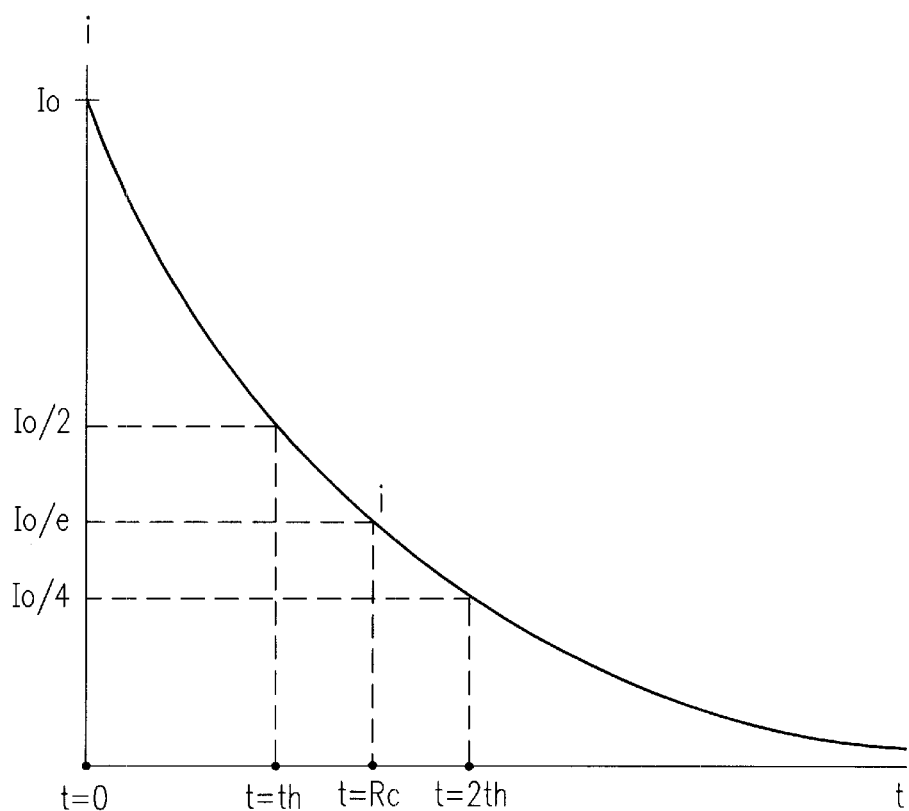
FIG. 3D shows the current (i), in an equivalent RC circuit in accordance with the principles of the present invention, as a function of time (t)

The result of this process is that the current in equivalent RC circuit 399, as well as the voltage drop across gate-bulk coupling capacitance 350 and the voltage drop across equivalent resistor 357, are exponential functions of time. FIG. 3D shows the current (i) in equivalent RC circuit 399 as a function of time (t). As can be seen in FIG. 3D, at time t=0, i.e., when a potential is applied to gate 304, current i is equal to I0. At t=th, current i has dropped to I0/2, half the initial value of i. By time t=RC, i.e., t equals the resistance of equivalent resistor 357 multiplied by the capacitance of gate-bulk coupling capacitance 350, current i has dropped to I0/e and, by time t=2th, i has dropped to I0/4.

The product RC, i.e., the resistance of equivalent resistor 357 multiplied by the capacitance of gate-bulk coupling capacitance 350, is called the time constant, or relaxation time, of equivalent RC circuit 399. Consequently, as can be seen in FIG. 3D, the relaxation time can be adjusted by choosing the appropriate value for equivalent resistor 357.

As discussed above, the dopant concentration in resistive wells 351 and 352 (FIG. 3A) can be varied to yield a desired resistance. In addition, the overall resistance between points 353A and 355A, in resistive well 351, and points 354A and 356A, in resistive well 352, can be varied by increasing or decreasing the horizontal distances 351A and 352A in resistive wells 351 and 352, respectively (FIG. 3A).

As a result, according to the invention, the relaxation time of equivalent RC circuit 399 (FIG. 3C) can be adjusted either by varying the dopant concentration of resistive well 351 or by varying the distance between points 353A and 355A in resistive well 351. In one embodiment of the invention, the dopant concentration and the distance between points 353A and 355A in resistive well 351 are selected so that the relaxation time (RC) of equivalent RC circuit 399 is five to fifty times the ramp time (391 and 393 in FIG. 3E) of the potential on gate 304 and drain 305. Consequently, the potential of the bulk material, V-bulk, (380 in FIG. 3E) returns to an equilibrium potential (381 in FIG. 3E) before the next clock period. This aspect of the invention, and FIG. 3E, are discussed in more detail below.

The result of creating equivalent RC circuit 399, using the resistive wells according to the structure of the invention, is best described with reference to FIG. 3E. FIG. 3E shows the relationship between: the gate potential 360 (Vg 360) of gate 304 (FIG. 3B); the drain potential 370 (Vd 370) of drain 305; and the bulk potential 380 (V-bulk 380) in device 301. As shown in FIG. 3E, at time T0: Vg 360 is at potential 361, typically near a digital zero; Vd 370 is at potential 371, typically near a digital one; and V-bulk 380 is at equilibrium potential 381, in one embodiment ground. In time interval 391, i.e., between T1 and T2: Vg 360 rises along ramp 363 from potential 361, typically near digital zero, to potential 365, typically near digital one; at the same time, due to gate-bulk coupling capacitance 350, V-bulk 381 tracks Vg 360 and increases from potential 381, typically ground, to potential 383, typically greater than ground, but less than digital one, along ramp 382. In one embodiment of the invention, V-bulk rises ⅓ to ⅕ the amount Vg rises. During this same time frame, i.e., time interval 391, Vd 370 remains relatively constant at near digital one. In time interval 395, i.e., from time T2 to time T3, Vg 360 remains relatively constant at value 365. However, with the introduction of equivalent RC circuit 399 (FIG. 3C) using the resistive wells according to the method and structure of the invention, V-bulk 380 falls back to equilibrium potential 381 along RC curve 384 such that by time T3, V-bulk 380 is back at virtually the same equilibrium potential 381 as it was at time T0. In addition, as discussed above, using the method and structure of the invention, the time for V-bulk 380 to fall back to equilibrium potential 381, i.e., time interval 395, can be predetermined by pre-selecting the appropriate doping levels of the resistive well 351 (FIG. 3B), the distance 351A between points 353A and 355A in resistive well 351 and the shape of well 351.

In time interval 393, i.e., between time T4 and T5, Vd 370 starts to fall from potential 371, typically near digital one, to potential 375, typically near digital zero, along ramp 373. Also in time interval 393, due to drain-bulk coupling capacitance 305A, V-bulk 380 tracks Vd 370 and drops from equilibrium potential 381 to a lower potential 387. In one embodiment of the invention, V-bulk falls ⅓ to ⅕ the amount Vd falls, along ramp 385 which tracks ramp 373. During this same time frame, i.e., time interval 393, Vg 360 typically remains relatively constant at near digital one. From time T5 forward, Vd 370 remains relatively constant at near digital zero. However, with the introduction of equivalent RC circuit 399 (FIG. 3C) using resistive wells according to the structure of the invention, V-bulk 380 rises back to equilibrium potential 381 along RC curve 389 such that by time T6, V-bulk 380 is back at virtually the same equilibrium potential 381 as it was at time T0. In addition, as discussed above, using the method and structure of the invention, the time for V-bulk 380 to rise back to equilibrium potential 381, i.e., time interval 397, can be predetermined by pre-selecting the appropriate doping levels of the resistive well 351 (FIG. 3B) and the distance 351A between points 353A and 355A in resistive well 351.

Figure 3E:
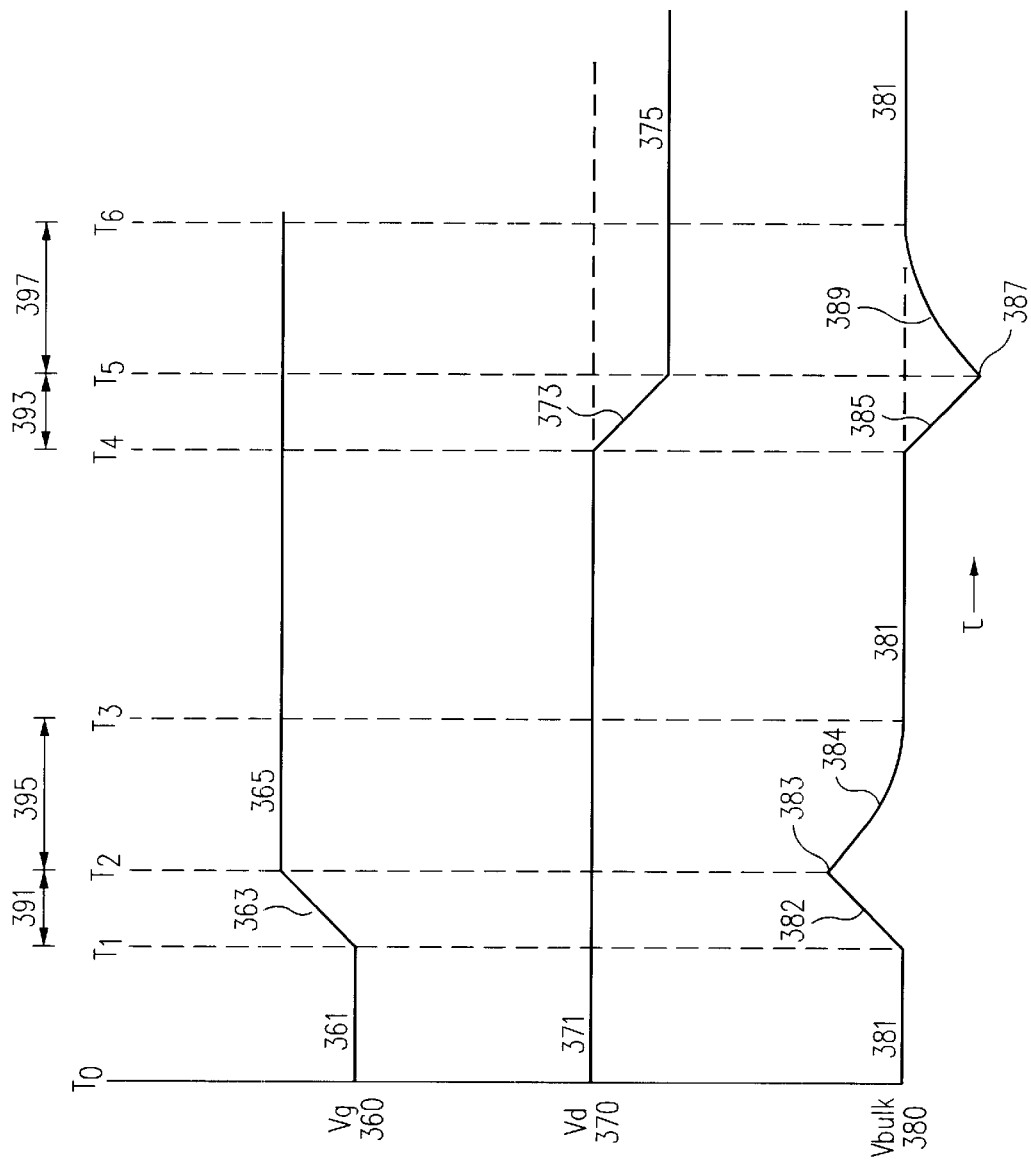
FIG. 3E shows the relationship between: the gate potential (Vg); the drain potential (Vd); and the bulk potential (V-bulk) in the device of FIG. 3B, in accordance with the principles of the present invention.

Note, in FIG. 3E, time interval 391 is shown graphically spaced from time interval 393, however those of skill in the art will recognize that in many cases time interval 391 will overlap with time interval 393 creating a more complex wave form. Consequently, the representation in FIG. 3E has been simplified for illustrative purposes.

As discussed above, according to the invention, the relaxation time (RC) of equivalent RC circuit 399 (FIG. 3C) can be adjusted either by varying the dopant concentration of resistive well 351 or by varying the distance between points 353A and 355A in resistive well 351. In one embodiment of the invention, the dopant concentration and the distance between points 353A and 355A in resistive well 351 are selected so that the relaxation time (RC), i.e., time intervals 395 and 397 in FIG. 3E, of equivalent RC circuit 399, and V-bulk 380, is five to fifty times the ramp time, i.e., time intervals 391 and 393 in FIG. 3E, of Vg 360 and Vd 370. Consequently, the potential of bulk material 306, V-bulk 380, returns to equilibrium potential 381 before the next clock period.

Figure 1E:
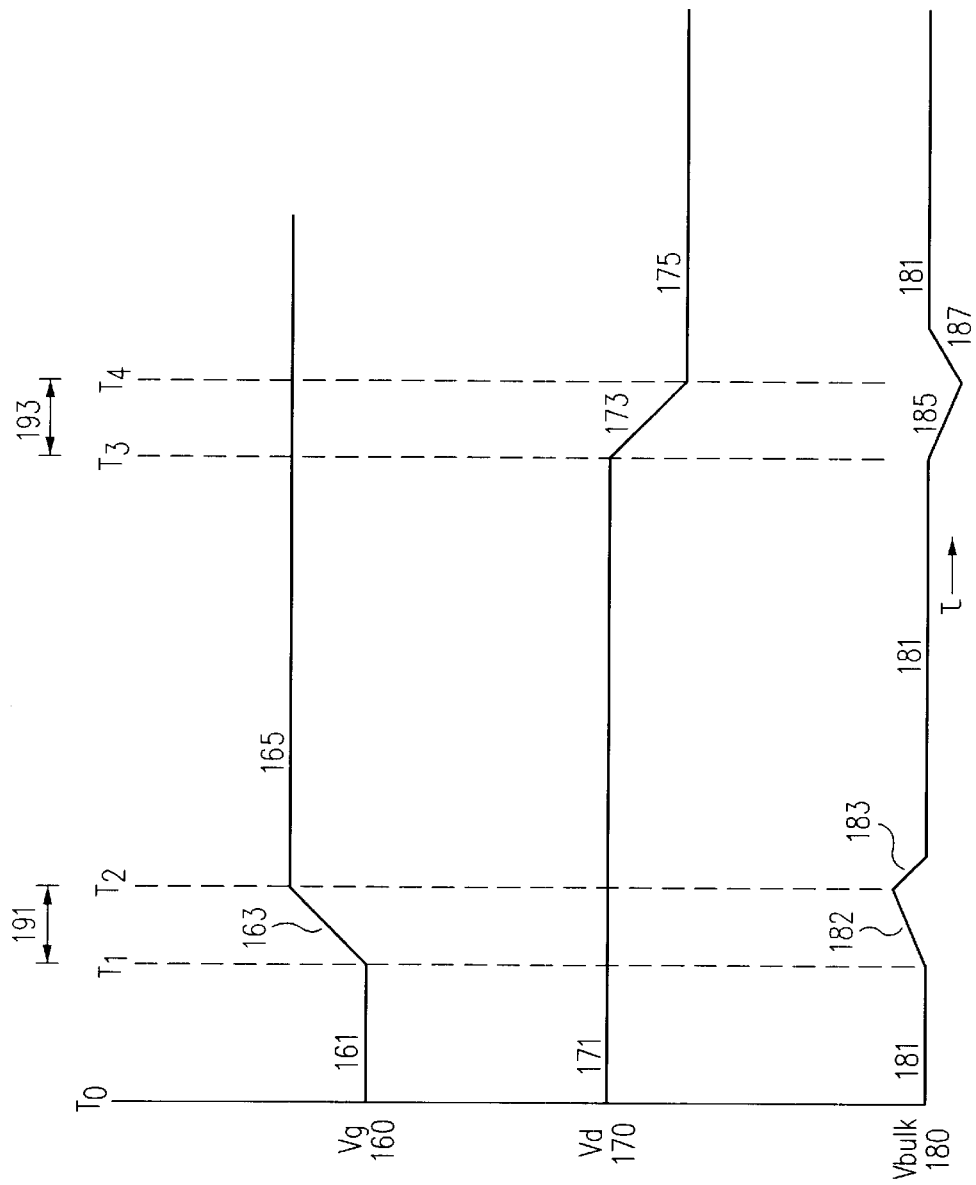
FIG. 1E shows the relationship between: the gate potential (Vg); the drain potential (Vd); and the bulk potential (V-bulk) in a prior art CMOS device designed according to the prior art teachings.
Figure 2A:
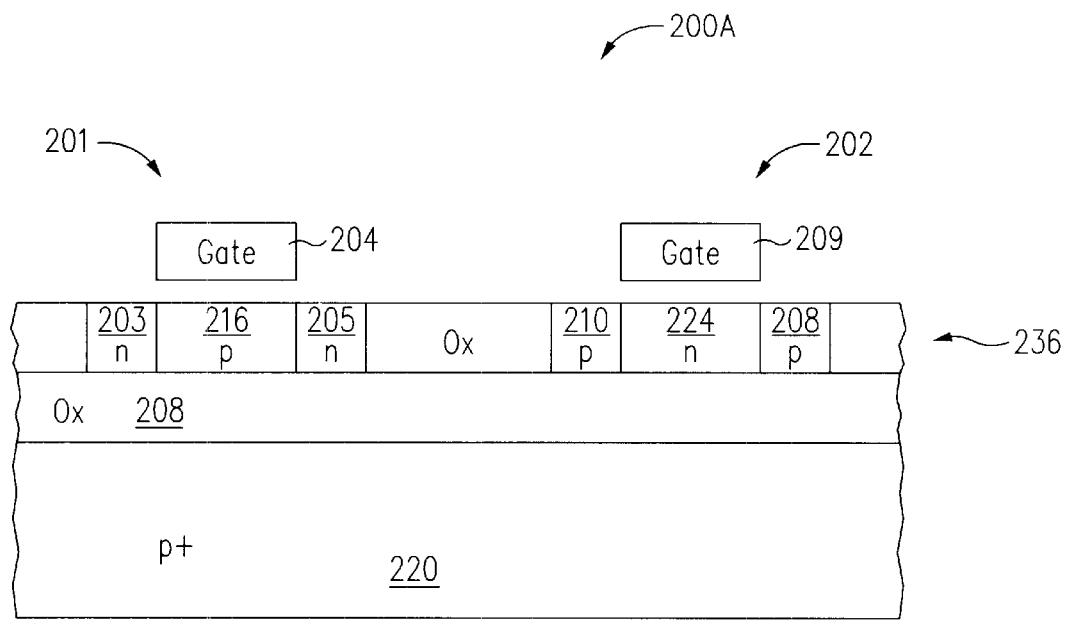
FIG. 2A illustrates an exemplary prior art SOI device.
Figure 2B:
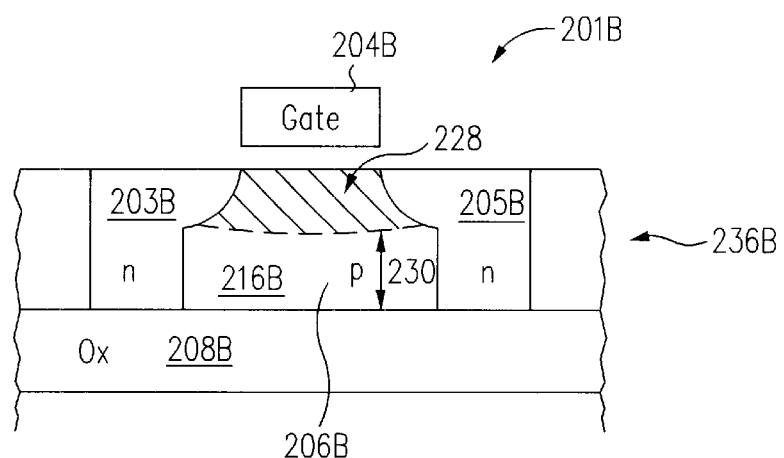
FIG. 2B shows a portion of a prior art partially depleted SOI NFET device.
Figure 2C:
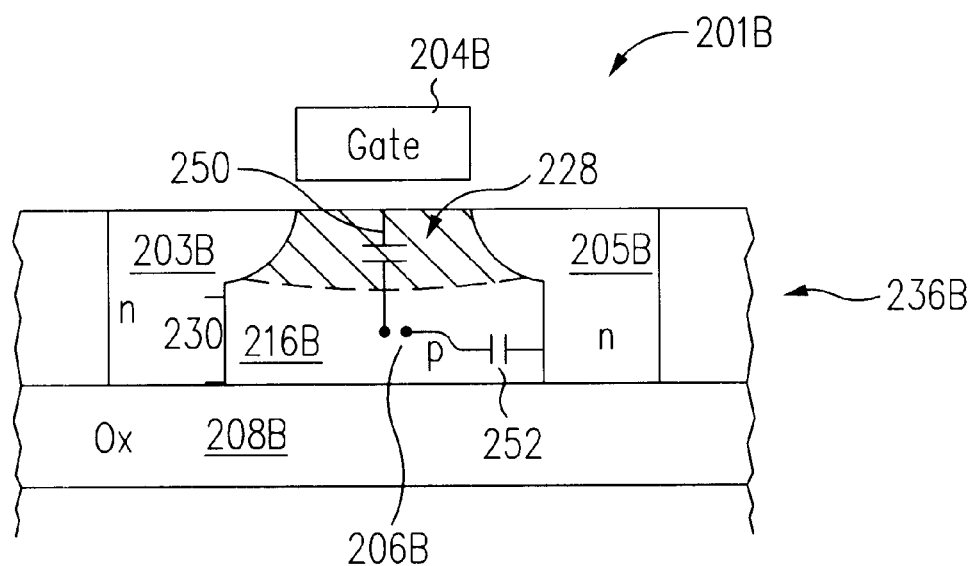
FIG. 2C shows the well-known effect of coupling capacitance between the gate and the bulk material region and the well known effect of coupling capacitance between the drain and the bulk material region in prior art partially depleted SOI devices.
Figure 2D:
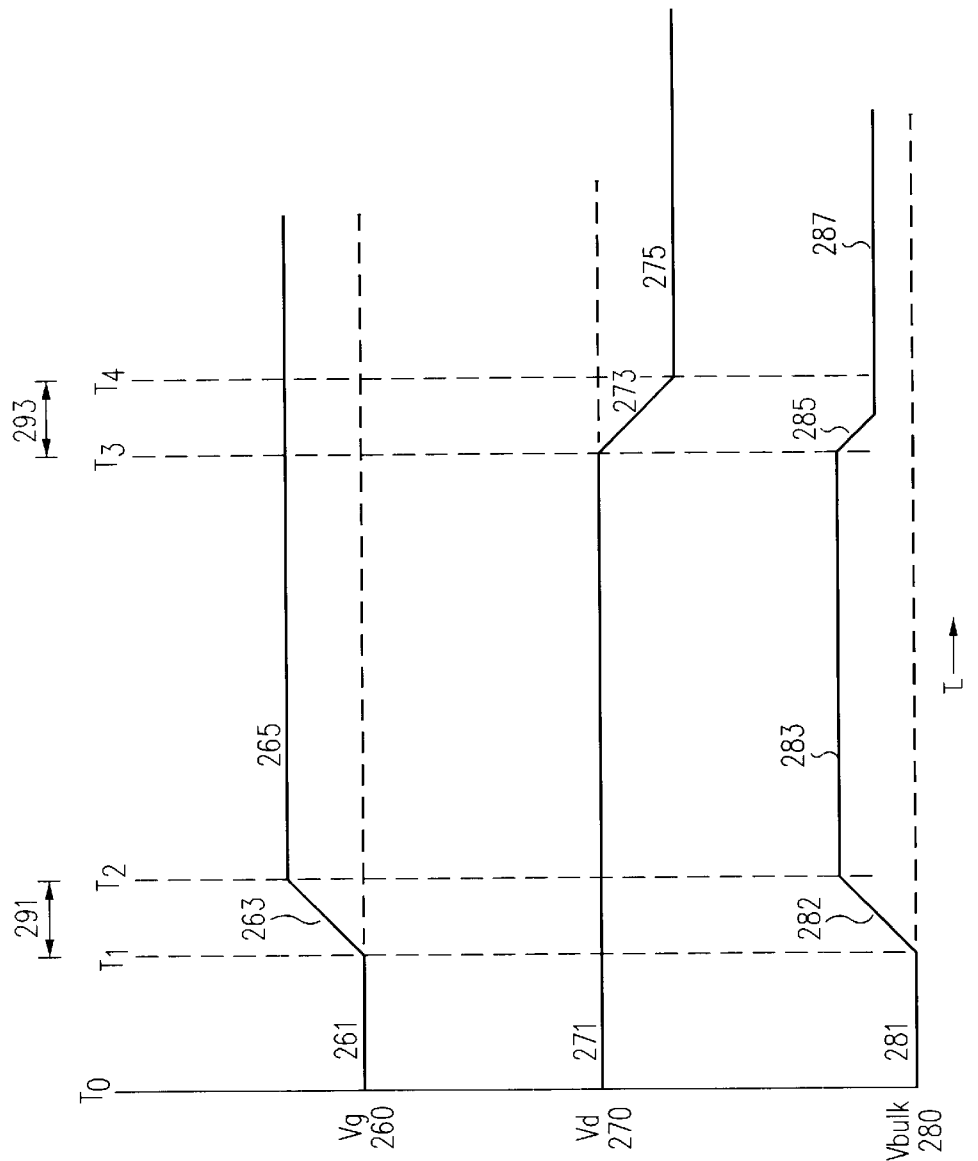
FIG. 2D illustrates the floating body effect by showing the relationship between: the gate potential (Vg); the drain potential (Vd); and the bulk potential (V-bulk) in a partially depleted SOI device designed according to the prior art structures and teachings.

As shown in FIG. 3E, with the introduction of equivalent RC circuit 399 according to the invention, V-bulk 380 tracks Vg 360 during time interval 391, just like prior art partially depleted SOI device 200A (See FIGS. 2C and 2D). Consequently, when the device is turning on, the threshold voltage of NFET 301 is advantageously lowered (FIG. 3E). Then, once NFET 301 is turned on, because of the introduction of equivalent resistance 357 (FIG. 3C) and equivalent RC circuit 399 according to the invention, V-bulk 380 falls back to equilibrium potential 381 (FIG. 3E) before the next clock period. Thus, NFET 301 shows the stability of prior art CMOS devices with a predictable and stable bulk material potential, V-bulk 380, and threshold voltage (FIG. 1E).

A similar, but reversed, process takes place when the device turns off, i.e., when Vg 360 goes back to a digital zero and Vd 370 goes back to a digital one. Consequently, the structure of the invention provides for devices whose threshold voltage lowers as the device turns on and then rises as the device turns off, like a partially depleted SOI device, yet has the equilibrium stability of prior art CMOS devices so that V-bulk returns to a relatively known value within one clock period.

In addition to the embodiments of the invention discussed above with respect to FIGS. 3A, 3B, 3C, 3D and 3E, other embodiments of the invention include different configurations of resistive path devices. Some devices according to the invention use resistive wells to form the resistive path while others do not use resistive wells at all. In these embodiments of the invention, a resistive path is created by simply controlling distances between elements in the device or by carefully controlling the physical parameters of the device such as the thickness of an epitaxial layer. FIGS. 4, 5, 6, 7A, 7B, 7C and 8 show just a few of the possible variations and configurations that can be formed in accordance with the principles of the present invention.

Figure 4:
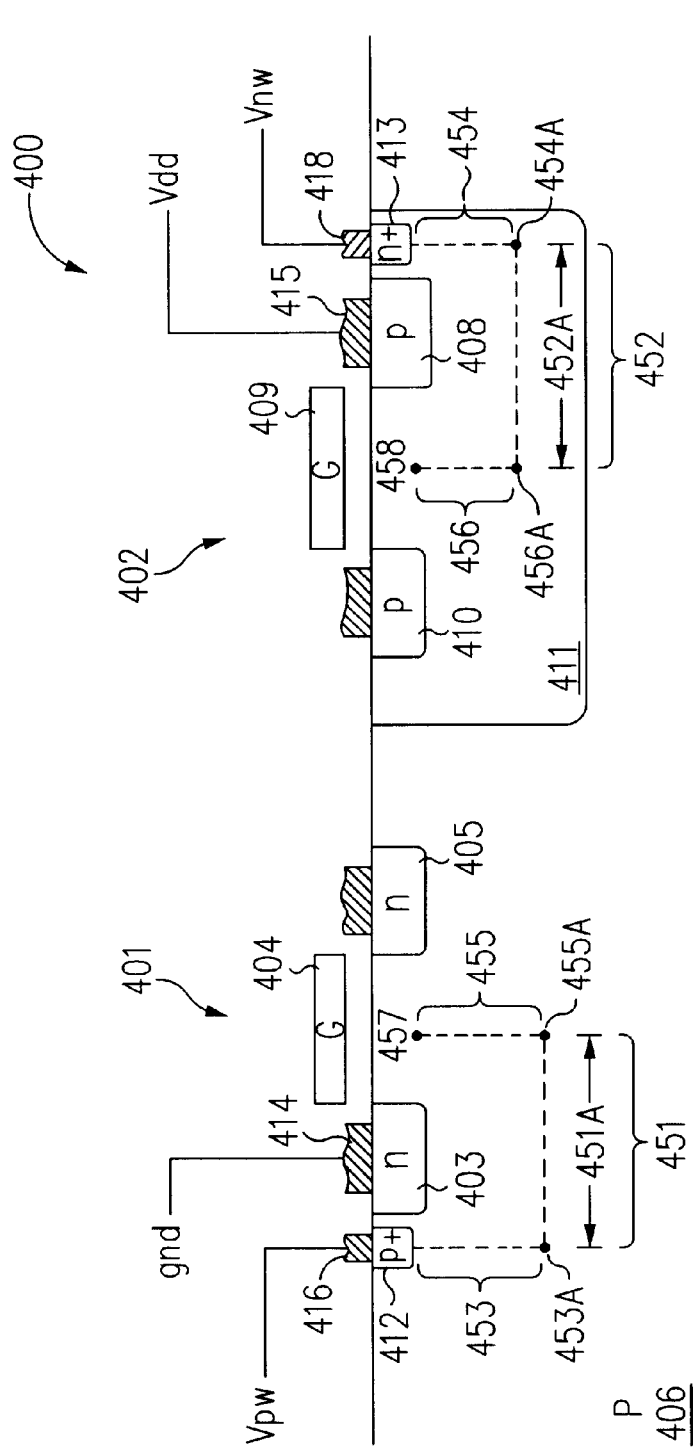
FIG. 4 shows an N-well resistive path device according to an embodiment of the invention.

FIG. 4 illustrates a resistive path device 400 according to one embodiment of the invention. Device 400 includes an NFET 401 and a PFET 402 each of which is essentially a four-terminal device. NFET 401 is made up of an N-region source 403, a gate electrode 404 and an N-region drain 405, formed in P-bulk material 406. Similarly, PFET 402 includes P-region source 408, a gate electrode 409 and a P-region drain 410 formed in an N-well bulk material 411. The device of FIG. 4 also includes a P+ plug that forms a well tie 412 and an N+ plug that forms a well tie 413.

In resistive path device 400, according to one embodiment of the invention, well tie 412 is electrically isolated from source terminal 403 of NFET 401 by providing a separate metallic rail contact 416 which is spaced from the metallic rail contact 414 of source 403. Rail contact 416 is coupled to a bias voltage source Vpw. Likewise, well contact 413 is split off from source 408 of PFET 402 by providing a separate metallic rail contact 418 that is electrically isolated from metallic rail contact 415 of source 408. Rail contact 418 is coupled to a bias voltage source Vnw.

According to the invention, resistive well device 400 also includes resistive paths 451 and 452. According to one embodiment of the invention, resistive path 451 is in P-bulk material 406. In one embodiment of the invention, resistive path 451 includes a horizontal distance 451A, between points 453A and 455A in P-bulk material 406, that can be varied to provide the desired resistance level.

According to one embodiment of the invention, the P+ plug that forms well tie 412 is electrically coupled to point 453A of resistive path 451 through path 453. Likewise, point 457 in P-bulk material 406, below the channel of NFET 401, is electrically coupled to point 455A of resistive path 451 through path 455. As noted above, horizontal distance 451A separates point 453A from point 455A and, according to the invention, the value of distance 451A is predetermined to provide a resistance within a desired range.

Similarly, According to one embodiment of the invention, resistive path 452 is in N-well bulk material 411. In one embodiment of the invention, resistive path 452 includes a horizontal distance 452A, between points 454A and 456A in N-well bulk material 411, that can be varied to provide the desired resistance level.

According to one embodiment of the invention, the N+ plug that forms well tie 413 is electrically coupled to point 454A of resistive path 452 through path 454. Likewise, point 458 in N-well bulk material 411, below the channel of PFET 402, is electrically coupled to point 456A of resistive path 452 through path 456. As noted above, horizontal distance 452A separates point 454A from point 456A and, according to the invention, the value of distance 452A is predetermined to provide a resistance within a desired range.

According to the invention, it is not necessary for the resistivity to be uniform within the P-bulk region 406 or N-well bulk region 411. All that is required is that the total resistivity along resistive paths 451 and 452 lie within bounds that both enable a transient floating body effect during turn-on and a return to an equilibrium potential before the next time the gate switches, as discussed in more detail above.

As also discussed above, the overall resistance between points 453A and 455A, in resistive path 451, and points 454A and 456A, in resistive path 452, can be varied by increasing or decreasing the horizontal distances 451A and 452A in resistive paths 451 and 452, respectively. Therefore, a higher resistance can be achieved by increasing the value of 451A and 452A, or a lower resistance can be achieved by decreasing the value of 451A and 452A.

As discussed above, in the prior art CMOS devices it was specifically taught that providing a resistive path between well tie 412 and point 457 or between well tie 413 and point 458 was to be avoided. As also discussed above, this teaching was adopted in light of the dual dangers of voltage drops due to large impact ionization currents and/or latch-up. However, as also discussed above, at source/drain (Vds) voltages of less than one volt, impact ionization currents drop off to insignificant levels (see FIG. 1D) and latch-up can be avoided by operating at supply voltages of less than 0.8 volt.

In addition, standard CMOS devices such as NFET 101 (FIG. 1C) require higher threshold voltages and higher threshold voltages require a higher dopant concentration, which also tends to lower resistivity in the vicinity of the channel. Consequently, while it is possible to engineer a resistive path in standard CMOS, it is easier in low power or ultra-low power CMOS, because the thresholds are lower and the path resistivity is naturally higher.

In one embodiment of the invention, the structure of FIG. 4 is a low-power or ultra-low power device where the source/drain (Vds) voltages, and the supply voltages, are significantly below 0.8 volt. In one embodiment of the invention, the supply voltage operates between 0.2 volt and 0.6 volt, depending on the operating conditions resulting in source/drain voltages between 0.2 volt and 0.6 volt.

By employing the structure of FIG. 4 in a low-power or ultra-low power environment, the present invention can be utilized without fear of large impact ionization currents, and the associated voltage drops across the bulk materials 406 and 411, and without fear of latch-up or device self destruct, as was the fear in the prior art.

Device 400 of FIG. 4 includes all of the advantages of device 300A, discussed above in connection with FIGS. 3A, 3B, 3C, 3D and 3E. In addition, device 400 does not necessitate the formation of buried resistive wells. Consequently, device 400 is a particularly economical implementation of the present invention.

Figure 5:
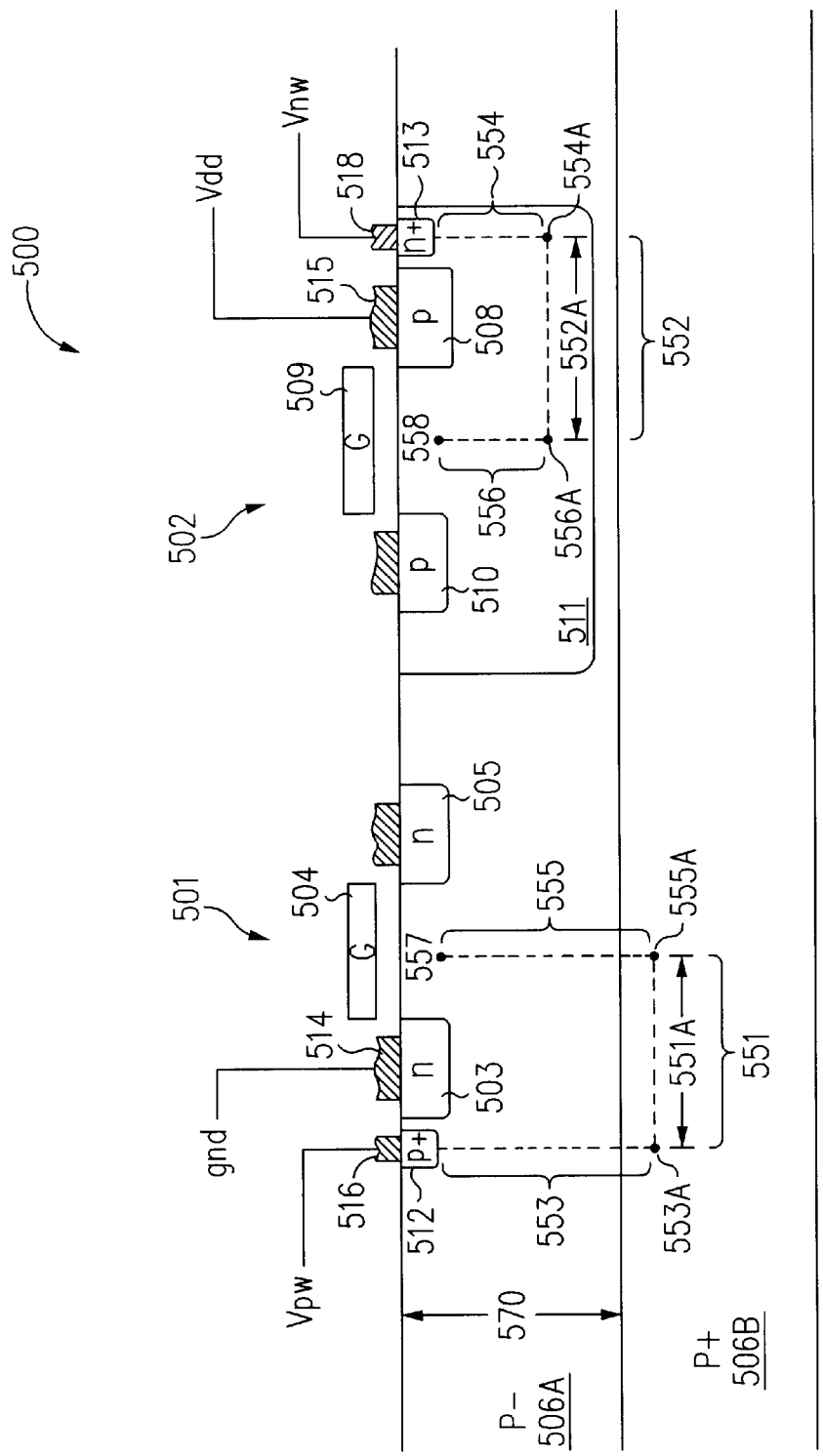
FIG. 5 shows a resistive path epitaxial device according to another embodiment of the invention.

FIG. 5 illustrates a resistive path epitaxial device 500 according to one embodiment of the invention. Device 500 includes an NFET 501 and a PFET 502 each of which is essentially a four-terminal device. In device 500, NFET 501 and a PFET 502, including N-well 511, are formed in an epitaxial lightly doped P-layer 506A formed over a heavily doped P-substrate 506B. NFET 501 is made up of an N-region source 503, a gate electrode 504 and an N-region drain 505 formed in lightly doped P-layer 506A. Similarly, PFET 502 includes P-region source 508, a gate electrode 509 and a P-region drain 510 formed in an N-well bulk material 511 with N-well bulk material 511 being formed in lightly doped P-layer 506A. The device of FIG. 5 also includes a P+ plug that forms a well tie 512 and an N+ plug that forms a well tie 513.

As discussed above, in the embodiment of the invention shown FIG. 5, layer 506A is lightly doped P-layer formed over a heavily doped P-substrate 506B. Those of skill in the art will recognize that in other embodiments, layer 506A is a P-layer while substrate 506B is an N+ substrate. In these embodiments, substrate 506B electrically isolates P-layer 506A so that additional subsurface P- and N- wells (not shown) may be included to provide suitably resistive paths according to the invention.

Returning to the embodiment shown in FIG. 5, in epitaxial resistive path device 500, according to one embodiment of the invention, well tie 512 is electrically isolated from source terminal 503 of the NFET 501 by providing a separate metallic rail contact 516 which is spaced from the metallic rail contact 514 of source 503. Rail contact 516 is coupled to a bias voltage source Vpw. Likewise, well contact 513 is split off from source 508 of PFET 502 by providing a separate metallic rail contact 518 that is electrically isolated from metallic rail contact 515 of source 508. Rail contact 518 is coupled to a bias voltage source Vnw.

According to the invention, epitaxial resistive path device 500 also includes resistive paths 551 and 552. According to one embodiment of the invention, resistive path 551 is in heavily doped P-substrate 506B. In one embodiment of the invention, resistive path 551 includes a horizontal distance 551A, between points 553A and 555A in heavily doped P-substrate 506B, that can be varied to provide the desired resistance level.

According to one embodiment of the invention, the P+ plug that forms well tie 512 is electrically coupled to point 553A of resistive path 551 via path 553. Path 553 extends through lightly doped P-layer 506A to point 553A in heavily doped P-substrate 506B. Likewise, point 557 in lightly doped P-layer 506A, below the channel of NFET 501, is electrically coupled to point 555A of resistive path 551 via path 555. Path 555 extends through lightly doped P-layer 506A to point 555A in heavily doped P-substrate 506B. As noted above, horizontal distance 551A separates point 553A from point 555A and, according to the invention, the value of distance 551A is predetermined to provide a resistance within a desired range.

According to the one embodiment of the invention shown in FIG. 5, resistive path 552 is in N-well bulk material 511. In one embodiment of the invention, resistive path 552 includes a horizontal distance 552A, between points 554A and 556A in N-well bulk material 511, that can be varied to provide the desired resistance level.

According to one embodiment of the invention, the N+ plug that forms well tie 513 is electrically coupled to point 554A of resistive path 552 through path 554. Likewise, point 558 in N-well bulk material 511, below the channel of PFET 502, is electrically coupled to point 556A of resistive path 552 through path 556. As noted above, horizontal distance 552A separates point 554A from point 556A and, according to the invention, the value of distance 552A is predetermined to provide a resistance within a desired range.

According to the invention, it is not necessary for the resistivity to be uniform within heavily doped P-substrate 506B or N-well bulk region 511. All that is required is that the total resistivity along resistive paths 551 and 552 lie within bounds that both enable a transient floating body effect during turn-on and a return to an equilibrium potential before the next time the gate switches, as discussed in more detail above.

As also discussed above, the overall resistance between points 553A and 555A, in resistive path 551, and points 554A and 556A, in resistive path 552, can be varied by increasing or decreasing the horizontal distances 551A and 552A in resistive paths 551 and 552, respectively. Therefore, a higher resistance can be achieved by increasing the value of 551A and 552A, or a lower resistance can be achieved by decreasing the value of 551A and 552A. In addition, with device 500, the overall resistance between points 553A and 555A, in resistive path 551 can be adjusted by increasing or decreasing the dopant concentration in heavily doped P-substrate 506B. In addition, the overall resistance between well tie 512 and point 557 or between well tie 513 and point 558 can be adjusted by changing the thickness 570 of epitaxial lightly doped P-layer 506A.

As discussed above, in the prior art CMOS devices it was specifically taught that providing a resistive path between well tie 512 and point 557 or between well tie 513 and point 558 was to be avoided. As also discussed above, this teaching was adopted in light of the dual dangers of voltage drops due to large impact ionization currents and/or latch-up. However, as also discussed above, at source/drain (Vds) voltages of less than one volt, impact ionization currents drop off to insignificant levels (see FIG. 1D) and latch-up can be avoided by operating at supply voltages of less than 0.8 volt.

In addition, standard CMOS devices such as NFET 101 (FIG. 1C) require higher threshold voltages and higher threshold voltages require a higher dopant concentration, which also tends to lower resistivity in the vicinity of the channel. Consequently, while it is possible to engineer a resistive path in standard CMOS, it is easier in low power or ultra-low power CMOS, because the thresholds are lower and the path resistivity is naturally higher.

In one embodiment of the invention, the structure of FIG. 5 is a low-power or ultra-low power device where the source/drain (Vds) voltages, and the supply voltages, are significantly below 0.8 volt. In one embodiment of the invention, the supply voltage operates between 0.2 volt and 0.6 volt, depending on the operating conditions resulting in source/drain voltages between 0.2 volt and 0.6 volt.

By employing the structure of FIG. 5 in a low-power or ultra-low power environment, the present invention can be utilized without fear of large impact ionization currents, and the associated voltage drops across the bulk materials 506 and 511, and without fear of latch-up or device self destruct, as was the fear in the prior art.

Device 500 of FIG. 5 includes all of the advantages of device 300A, discussed above in connection with FIGS. 3A, 3B, 3C, 3D and 3E. In addition, device 500 does not necessitate the formation of buried resistive paths other than the use of heavily doped P-substrate 506B. Consequently, device 500 is another particularly economical implementation of the present invention.

Figure 6:
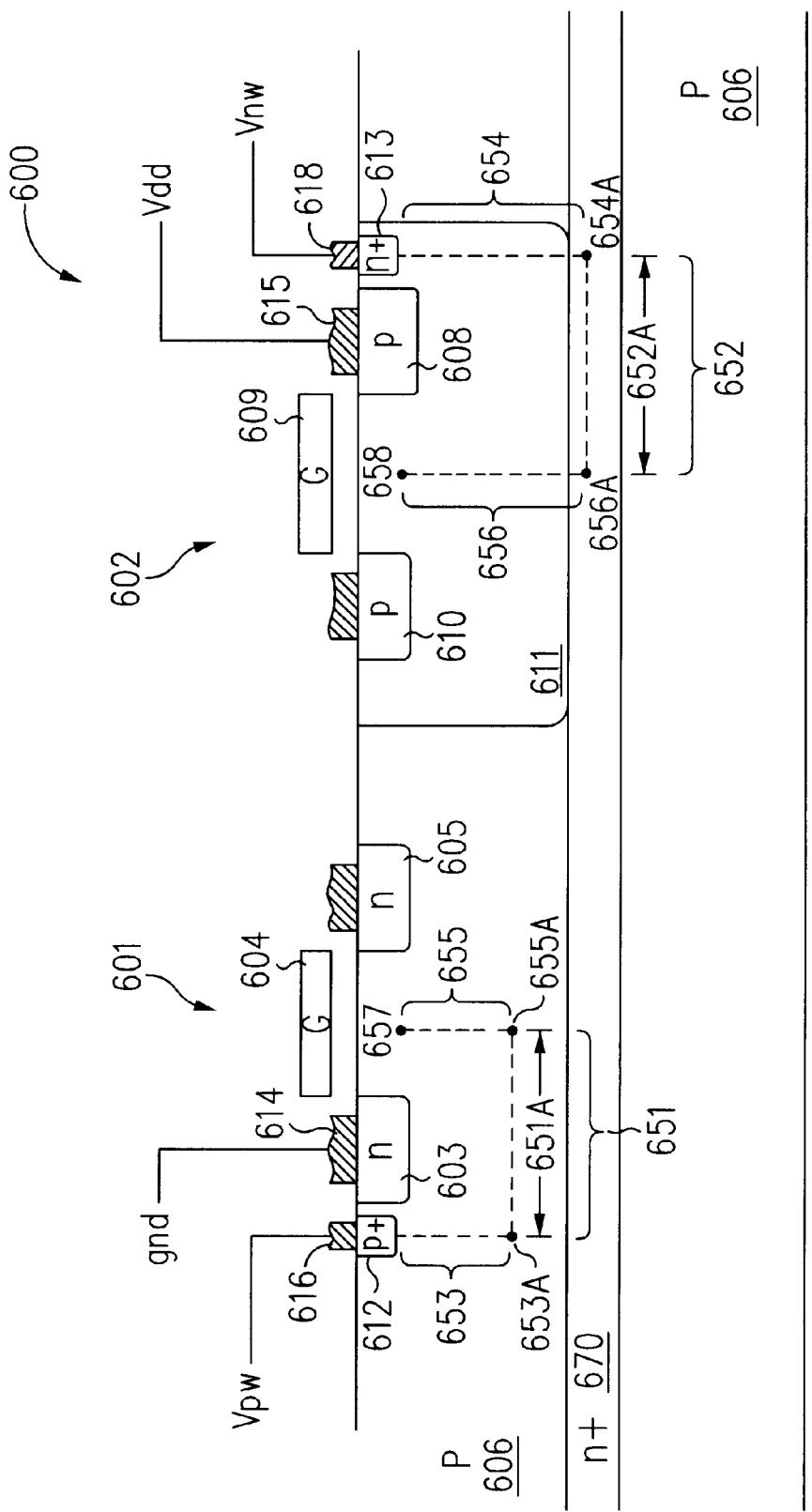
FIG. 6 shows a buried N-well resistive path device according to another embodiment of the invention.

FIG. 6 illustrates a buried N-well resistive path device 600 according to one embodiment of the invention. Device 600 includes an NFET 601 and a PFET 602 each of which is essentially a four-terminal device. Device 600 also includes heavily doped buried N-well 670. In device 600, NFET 601 and a PFET 602, including N-well 611, are formed in P-bulk material 606. NFET 601 is made up of an N-region source 603, a gate electrode 604 and an N-region drain 605. Similarly, PFET 602 includes P-region source 608, a gate electrode 609 and a P-region drain 610 formed in an N-well bulk material 611. The device of FIG. 6 also includes a P+ plug that forms a well tie 612 and an N+ plug that forms a well tie 613.

In buried N-well resistive path device 600, according to one embodiment of the invention, well tie 612 is electrically isolated from source terminal 603 of the NFET 601 by providing a separate metallic rail contact 616 which is spaced from the metallic rail contact 614 of source 603. Rail contact 616 is coupled to a bias voltage source Vpw. Likewise, well contact 613 is split off from source 608 of PFET 602 by providing a separate metallic rail contact 618 that is electrically isolated from metallic rail contact 615 of source 608. Rail contact 618 is coupled to a bias voltage source Vnw.

According to the invention, buried N-well resistive path device 600 also includes resistive paths 651 and 652. According to one embodiment of the invention, resistive path 651 is in P-bulk material 606. In one embodiment of the invention, resistive path 651 includes a horizontal distance 651A, between points 653A and 655A in P-bulk material 606, that can be varied to provide the desired resistance level.

According to one embodiment of the invention, the P+ plug that forms well tie 612 is electrically coupled to point 653A in P-bulk material 606 via path 653. Likewise, point 657 in P-bulk material 606, below the channel of NFET 601, is electrically coupled to point 655A of resistive path 651 in P-bulk material 606 via path 655. As noted above, horizontal distance 651A separates point 653A from point 655A and, according to the invention, the value of distance 651A is predetermined to provide a resistance within a desired range.

According to the one embodiment of the invention shown in FIG. 6, resistive path 652 is in heavily doped buried N-well 670. In one embodiment of the invention, resistive path 652 includes a horizontal distance 652A, between points 654A and 656A in heavily doped buried N-well 670. According to the invention, horizontal distance 652A can be varied to provide the desired resistance level.

According to one embodiment, of the invention, the N+ plug that forms well tie 613 is electrically coupled to point 654A of resistive path 652 via path 654. Path 654 passes through N-well bulk material 611 to point 654A in heavily doped buried N-well 670. Likewise, point 658 in N-well bulk material 611, below the channel of PFET 602, is electrically coupled to point 656A of resistive path 652 via path 656. Path 656 passes through N-well bulk material 611 to point 656A in heavily doped buried N-well 670. As noted above, horizontal distance 652A separates point 654A from point 656A and, according to the invention, the value of distance 652A is predetermined to provide a resistance within a desired range.

According to the invention, it is not necessary for the resistivity to be uniform within P-bulk material 606 or heavily doped buried N-well 670. All that is required is that the total resistivity along resistive paths 651 and 652 lie within bounds that both enable a transient floating body effect during turn-on and a return to an equilibrium potential before the next time the gate switches, as discussed in more detail above.

As discussed above, the overall resistance between points 653A and 655A, in resistive path 651, and points 654A and 656A, in resistive path 652, can be varied by increasing or decreasing the horizontal distances 651A and 652A in resistive paths 651 and 652, respectively. Therefore, a higher resistance can be achieved by increasing the value of 651A and 652A, or a lower resistance can be achieved by decreasing the value of 651A and 652A. In addition, with device 600, the overall resistance between points 654A and 656A, in resistive path 652, can be adjusted by increasing or decreasing the dopant concentration in heavily doped buried N-well 670.

As discussed above, in the prior art CMOS devices it was specifically taught that providing a resistive path between well tie 612 and point 657 or between well tie 613 and point 658 was to be avoided. As also discussed above, this teaching was adopted in light of the dual dangers of voltage drops due to large impact ionization currents and/or latch-up. However, as also discussed above, at source/drain (Vds) voltages of less than one volt, impact ionization currents drop off to insignificant levels (see FIG. 1D) and latch-up can be avoided by operating at supply voltages of less than 0.8 volt.

In addition, standard CMOS devices such as NFET 101 (FIG. 1C) require higher threshold voltages and higher threshold voltages require a higher dopant concentration, which also tends to lower resistivity in the vicinity of the channel. Consequently, while it is possible to engineer a resistive path in standard CMOS, it is easier in low power or ultra-low power CMOS, because the thresholds are lower and the path resistivity is naturally higher.

In one embodiment of the invention, the structure of FIG. 6 is a low-power or ultra-low power device where the source/drain (Vds) voltages, and the supply voltages, are significantly below 0.8 volt. In one embodiment of the invention, the supply voltage operates between 0.2 volt and 0.6 volt, depending on the operating conditions resulting in source/drain voltages between 0.2 volt and 0.6 volt.

By employing the structure of FIG. 6 in a low-power or ultra-low power environment, the present invention can be utilized without fear of large impact ionization currents, and the associated voltage drops across the bulk materials 606 and 611, and without fear of latch-up or device self destruct, as was the fear in the prior art.

Device 600 of FIG. 6 includes all of the advantages of device 300A, discussed above in connection with FIGS. 3A, 3B, 3C, 3D and 3E. In addition, device 600 does not necessitate the formation of two buried resistive paths. Instead, only the single heavily doped buried N-well 670 is required. Consequently, device 600 is another economical implementation of the present invention.

Figure 7A:
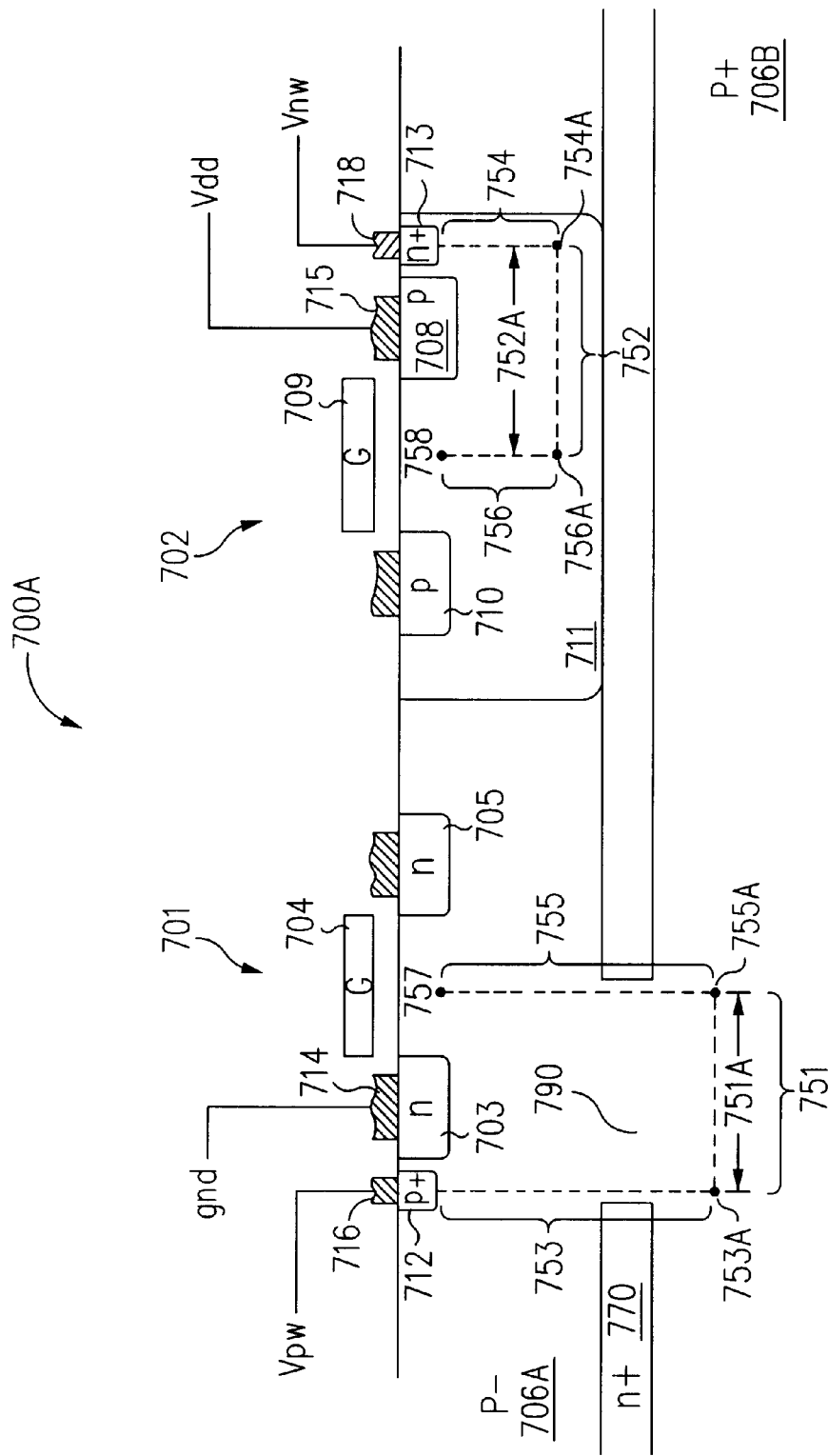
FIG. 7A shows a perforated buried N-well resistive path device according to another embodiment of the invention.

FIG. 7A illustrates a perforated buried N-well resistive path device 700A according to one embodiment of the invention. Device 700A includes an NFET 701 and a PFET 702 each of which is essentially a four-terminal device. In device 700A, NFET 701 and a PFET 702, including N-well 711, are formed in lightly doped P-layer 706A which is formed on heavily doped P-substrate 706B. Device 700A also includes heavily doped perforated buried N-well 770 formed between lightly doped P-layer 706A and heavily doped P-substrate 706B. NFET 701 is made up of an N-region source 703, a gate electrode 704 and an N-region drain 705. Similarly, PFET 702 includes P-region source 708, a gate electrode 709 and a P-region drain 710 formed in an N-well bulk material 711. The device of FIG. 7A also includes a P+ plug that forms a well tie 712 and an N+ plug that forms a well tie 713.

In perforated buried N-well resistive path device 700A, according to one embodiment of the invention, well tie 712 is electrically isolated from source terminal 703 of the NFET 701 by providing a separate metallic rail contact 716 which is spaced from the metallic rail contact 714 of source 703. Rail contact 716 is coupled to a bias voltage source Vpw. Likewise, well tie 713 is split off from source 708 of PFET 702 by providing a separate metallic rail contact 718 that is electrically isolated from metallic rail contact 715 of source 708. Rail contact 718 is coupled to a bias voltage source Vnw.

According to the invention, perforated buried N-well resistive path device 700A also includes resistive paths 751 and 752. According to one embodiment of the invention, resistive path 751 is in heavily doped P-substrate 706B. In one embodiment of the invention, resistive path 751 includes a horizontal distance 751A, between points 753A and 755A in heavily doped P-substrate 706B, that can be varied to provide the desired resistance level.

According to one embodiment of the invention, the P+ plug that forms well tie 712 is electrically coupled to point 753A in heavily doped P-substrate 706B via path 753. Path 753 extends through perforation 790 in heavily doped perforated buried N-well 770 to heavily doped P-substrate 706B. Likewise, point 757 in lightly doped P-layer 706A, below the channel of NFET 701, is electrically coupled to point 755A of resistive path 751 in heavily doped P-substrate 706B via path 755. Path 755 extends through perforation 790 in heavily doped perforated buried N-well 770 to heavily doped P-substrate 706B. As noted above, horizontal distance 751A separates point 753A from point 755A and, according to the invention, the value of distance 751A is predetermined to provide a resistance within a desired range.

According to the one embodiment of the invention shown in FIG. 7A, resistive path 752 is in N-well bulk material 711. In one embodiment of the invention, resistive path 752 includes a horizontal distance 752A, between points 754A and 756A in N-well bulk material 711, that can be varied to provide the desired resistance level.

According to one embodiment of the invention, the N+ plug that forms well tie 713 is electrically coupled to point 754A of resistive path 752, via path 754. Likewise, point 758 in N-well bulk material 711, below the channel of PFET 702, is electrically coupled to point 756A of resistive path 752, via path 756. As noted above, horizontal distance 752A separates point 754A from point 756A and, according to the invention, the value of distance 752A is predetermined to provide a resistance within a desired range.

According to the invention, it is not necessary for the resistivity to be uniform within heavily doped P-substrate 706B or N-well bulk material 711. All that is required is that the total resistivity along resistive paths 751 and 752 lie within bounds that both enable a transient floating body effect during turn-on and a return to an equilibrium potential before the next time the gate switches, as discussed in more detail above.

As discussed above, the overall resistance between points 753A and 755A, in resistive path 751, and points 754A and 756A, in resistive path 752, can be varied by increasing or decreasing the horizontal distances 751A and 752A in resistive paths 751 and 752, respectively. Therefore, a higher resistance can be achieved by increasing the value of 751A and 752A, or a lower resistance can be achieved by decreasing the value of 751A and 752A. In addition, with device 700A, the overall resistance between points 753A and 755A, in resistive path 751, can be adjusted by increasing or decreasing the dopant concentration in heavily doped P-substrate 706B.

Figure 7B:
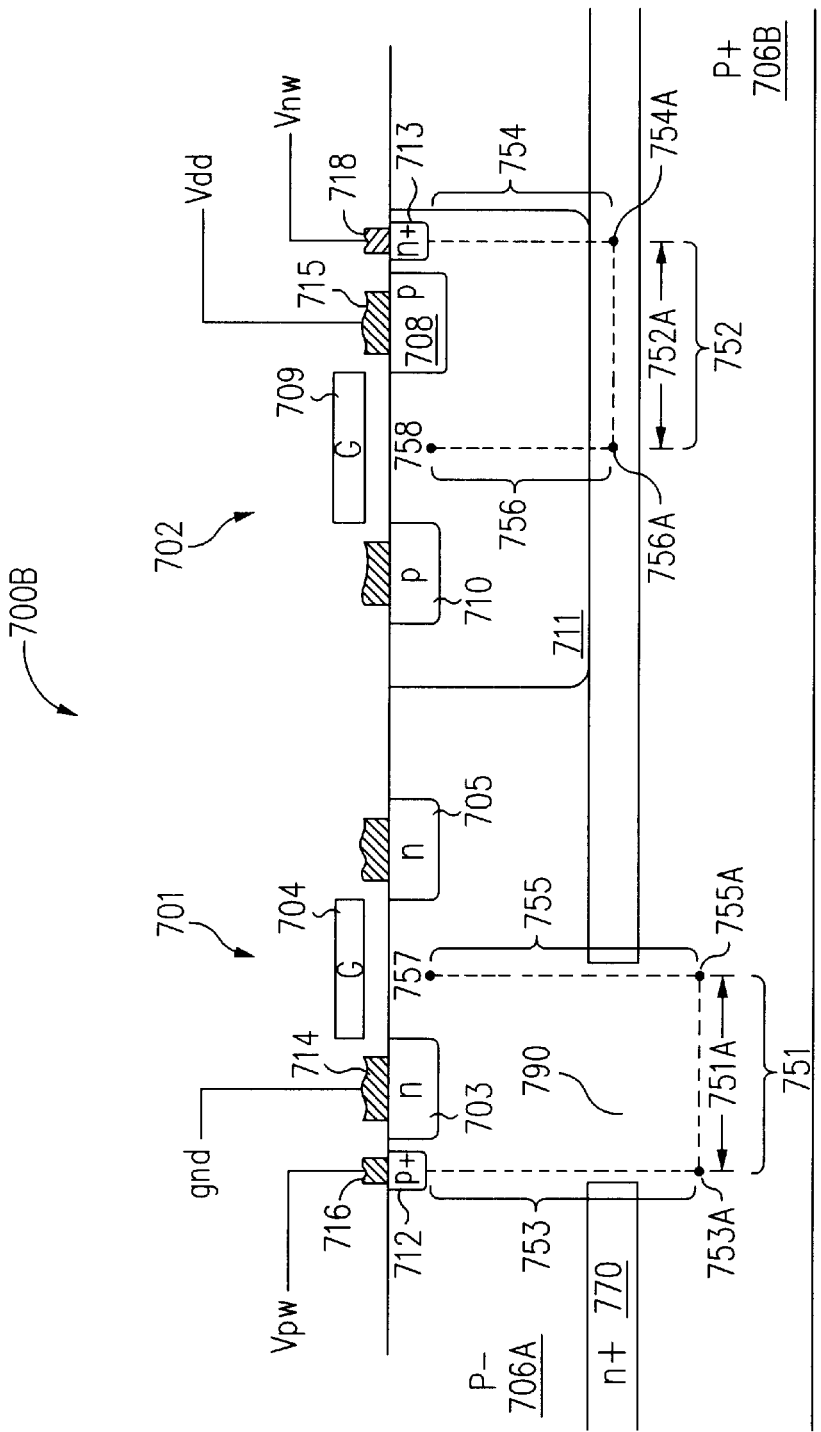
FIG. 7B shows a second embodiment of a perforated buried N-well resistive path device according to the invention.

FIG. 7B illustrates a perforated buried N-well resistive path device 700B according to one embodiment of the invention. Device 700B includes an NFET 701 and a PFET 702 each of which is essentially a four-terminal device. In device 700B, NFET 701 and a PFET 702, including N-well 711, are formed in lightly doped P-layer 706A which is formed on heavily doped P-substrate 706B. Device 700B also includes heavily doped perforated buried N-well 770 formed between lightly doped P-layer 706A and heavily doped P-substrate 706B. NFET 701 is made up of an N-region source 703, a gate electrode 704 and an N-region drain 705. Similarly, PFET 702 includes P-region source 708, a gate electrode 709 and a P-region drain 710 formed in an N-well bulk material 711. The device of FIG. 7B also includes a P+ plug that forms a well tie 712 and an N+ plug that forms a well tie 713.

In perforated buried N-well resistive path device 700B, according to one embodiment of the invention, well tie 712 is electrically isolated from source terminal 703 of the NFET 701 by providing a separate metallic rail contact 716 which is spaced from the metallic rail contact 714 of source 703. Rail contact 716 is coupled to a bias voltage source Vpw. Likewise, well contact 713 is split off from source 708 of PFET 702 by providing a separate metallic rail contact 718 that is electrically isolated from metallic rail contact 715 of source 708. Rail contact 718 is coupled to a bias voltage source Vnw.

According to the invention, perforated buried N-well resistive path device 700B also includes resistive paths 751 and 752. According to one embodiment of the invention, resistive path 751 is in heavily doped P-substrate 706B. In one embodiment of the invention, resistive path 751 includes a horizontal distance 751A, between points 753A and 755A in heavily doped P-substrate 706B, that can be varied to provide the desired resistance level.

According to one embodiment of the invention, the P+ plug that forms well tie 712 is electrically coupled to point 753A in heavily doped P-substrate 706B via path 753. Path 753 extends through perforation 790 in heavily doped perforated buried N-well 770 to heavily doped P-substrate 706B. Likewise, point 757 in P-bulk material 706, below the channel of NFET 701, is electrically coupled to point 755A of resistive path 751 in heavily doped P-substrate 706B via path 755. Path 755 extends through perforation 790 in heavily doped perforated buried N-well 770 to heavily doped P-substrate 706B. As noted above, horizontal distance 751A separates point 753A from point 755A and, according to the invention, the value of distance 751A is predetermined to provide a resistance within a desired range.

According to the one embodiment of the invention shown in FIG. 7B, resistive path 752 is in heavily doped perforated buried N-well 770. In one embodiment of the invention, resistive path 752 includes a horizontal distance 752A, between points 754A and 756A in heavily doped perforated buried N-well 770, that can be varied to provide the desired resistance level.

According to one embodiment of the invention, the N+ plug that forms well tie 713 is electrically coupled to point 754A of resistive path 752 via path 754. Path 754 passes through N-well bulk material 711 to point 754A in heavily doped perforated buried N-well 770. Likewise, point 758 in N-well bulk material 711, below the channel of PFET 702, is electrically coupled to point 756A of resistive path 752 via path 756. Path 756 passes through N-well bulk material 711 to point 756A in heavily doped perforated buried N-well 770. As noted above, horizontal distance 752A separates point 754A from point 756A and, according to the invention, the value of distance 752A is predetermined to provide a resistance within a desired range.

According to the invention, it is not necessary for the resistivity to be uniform within heavily doped P-substrate 706B or heavily doped perforated buried N-well 770. All that is required is that the total resistivity along resistive paths 751 and 752 lie within bounds that both enable a transient floating body effect during turn-on and a return to an equilibrium potential before the next time the gate switches, as discussed in more detail above.

As also discussed above, the overall resistance between points 753A and 755A, in resistive path 751, and points 754A and 756A, in resistive path 752, can be varied by increasing or decreasing the horizontal distances 751A and 752A in resistive paths 751 and 752, respectively. Therefore, a higher resistance can be achieved by increasing the value of 751A and 752A, or a lower resistance can be achieved by decreasing the value of 751A and 752A. In addition, with device 700B, the overall resistance between points 754A and 756A, in resistive path 752, can be adjusted by increasing or decreasing the dopant concentration in heavily doped perforated buried N-well 770. In addition, with device 700B, the overall resistance between points 753A and 755A, in resistive path 751, can be adjusted by increasing or decreasing the dopant concentration in heavily doped P-substrate 706B.

Figure 7C:
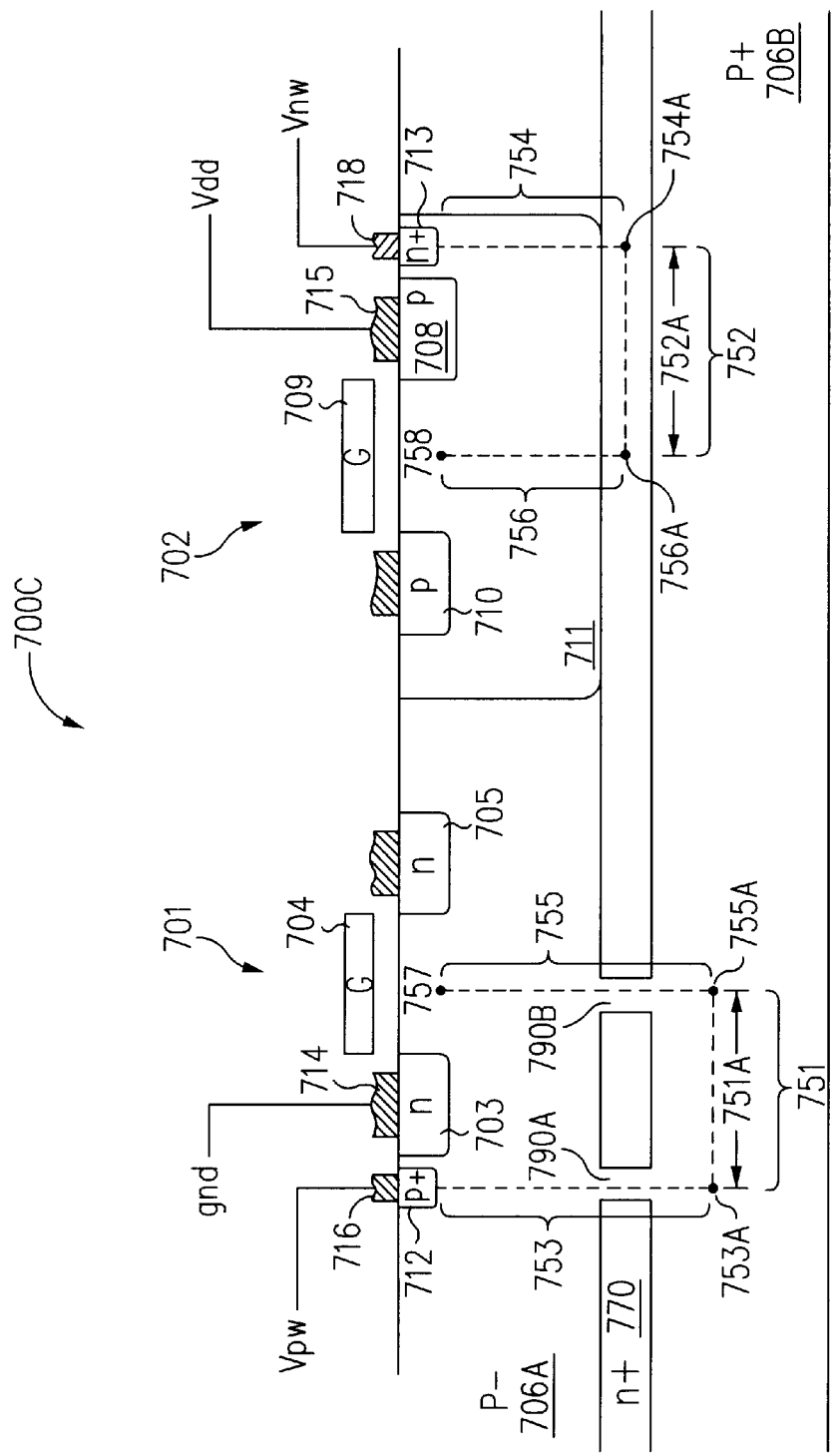
FIG. 7C shows a third embodiment of a perforated buried N-well resistive path device according to the invention.

FIG. 7C illustrates another embodiment of a perforated buried N-well resistive path device 700C according to one embodiment of the invention. Device 700C is identical to device 700B discussed above except that device 700C includes two perforations, 790A and 790B, in heavily doped perforated buried N-well 770 in place of the single perforation 790 of device 700B. According to this embodiment of the invention, the P+ plug that forms well tie 712 is electrically coupled to point 753A in heavily doped P-substrate 706B via path 753. Path 753 extends through perforation 790A in heavily doped perforated buried N-well 770 to heavily doped P-substrate 706B. Likewise, point 757 in P-bulk material 706, below the channel of NFET 701, is electrically coupled to point 755A of resistive path 751 in heavily doped P-substrate 706B via path 755. Path 755 extends through perforation 790B in heavily doped perforated buried N-well 770 to heavily doped P-substrate 706B. As noted above, horizontal distance 751A separates point 753A from point 755A and, according to the invention, the value of distance 751A is predetermined to provide a resistance within a desired range.

As discussed above, in the prior art CMOS devices it was specifically taught that providing a resistive path between well tie 712 and point 757 or between well tie 713 and point 758 was to be avoided. As also discussed above, this teaching was adopted in light of the dual dangers of voltage drops due to large impact ionization currents and/or latch-up. However, as also discussed above, at source/drain (Vds) voltages of less than one volt, impact ionization currents drop off to insignificant levels (see FIG. 1D) and latch-up can be avoided by operating at supply voltages of less than 0.8 volt.

In addition, standard CMOS devices such as NFET 101 (FIG. 1C) require higher threshold voltages and higher threshold voltages require a higher dopant concentration, which also tends to lower resistivity in the vicinity of the channel. Consequently, while it is possible to engineer a resistive path in standard CMOS, it is easier in low power or ultra-low power CMOS, because the thresholds are lower and the path resistivity is naturally higher.

In some embodiments of the invention, the structures of FIGS. 7A, 7B and 7C are low-power or ultra-low power devices where the source/drain (Vds) voltages, and the supply voltages, are significantly below 0.8 volt. In one embodiment of the invention, the supply voltage operates between 0.2 volt and 0.6 volt, depending on the operating conditions resulting in source/drain voltages between 0.2 volt and 0.6 volt.

By employing the structures of FIG. 7A, 7B or 7C in a low-power or ultra-low power environment, the present invention can be utilized without fear of large impact ionization currents, and the associated voltage drops across the bulk materials 706 and 711, and without fear of latch-up or device self destruct, as was the fear in the prior art.

Devices 700A, 700B and 700C of FIGS. 7A, 7B and 7C include all of the advantages of device 300A discussed above in connection with FIGS. 3A, 3B, 3C, 3D and 3E. In addition, devices 700A, 700B and 700C do not necessitate the formation of two buried resistive paths. Instead, only the single heavily doped perforated buried N-well 770 is required. Consequently, devices 700A, 700B and 700C represent another economical implementation of the present invention.

Figure 8:
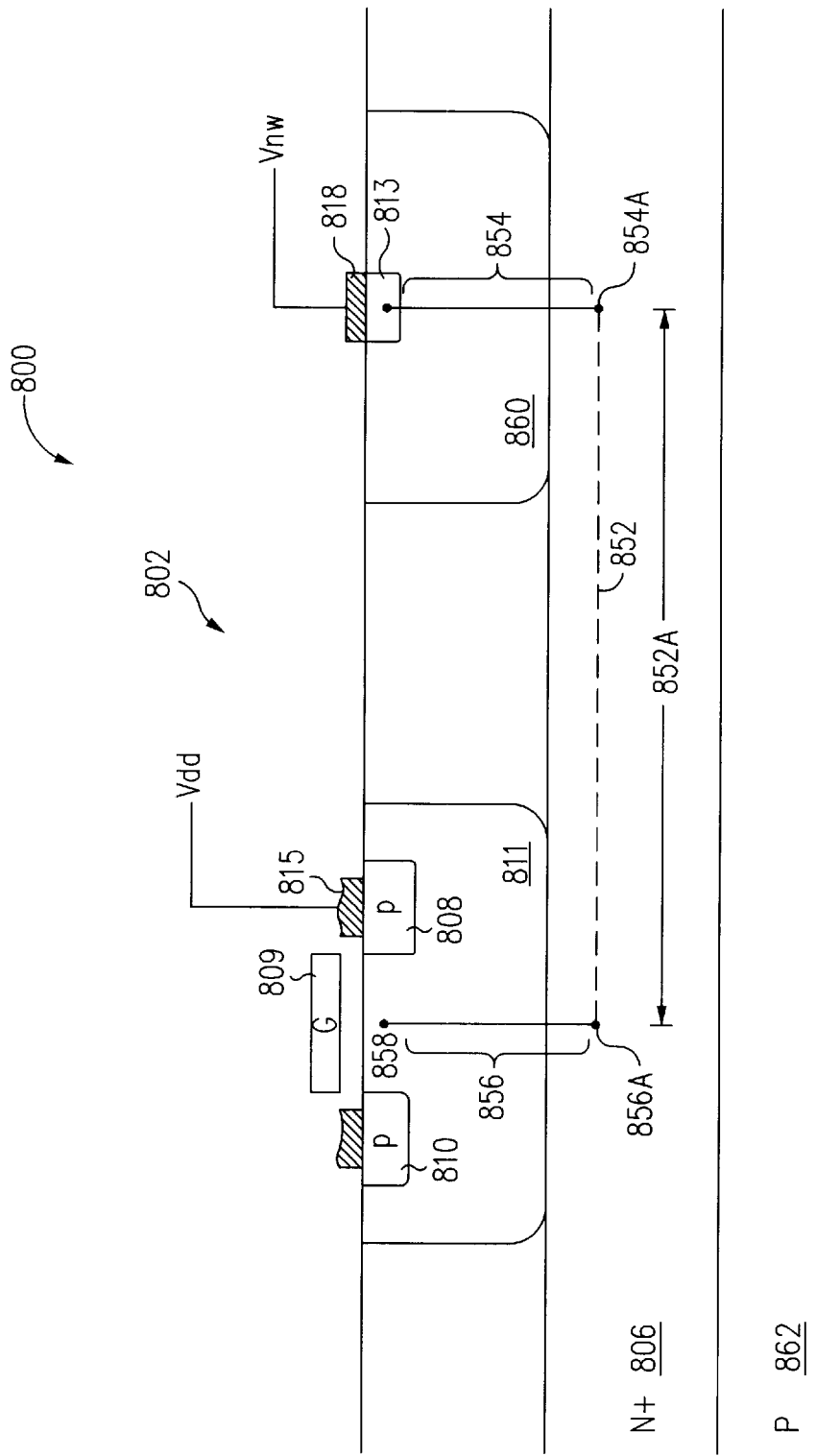
FIG. 8 shows an N-well resistive path device according to another embodiment of the invention.

FIG. 8 illustrates a resistive path device 800, which includes a N+ plug 813 that forms a well tie 818 according to one embodiment of the invention. Device 800 includes a PFET 802 that is essentially a four-terminal device. PFET 802 includes P-region source 808, a gate electrode 809 and a P-region drain 810 formed in an N-well bulk material 811. Device 800 of FIG. 8 also includes a N+ plug 813 that forms a well tie 813. In the embodiment of the invention shown in FIG. 8, N+ plug 813 sits in a second well bulk material 860.

Those of skill in the art will recognize that, in FIG. 8, device 800 is chosen to include a PFET 802 for illustrative purposes only. In other embodiments of the invention, FET 802 is an NFET and the polarities of the corresponding components of device 800 are reversed accordingly. Consequently, in FIG. 8, PFET 802 was chosen for simplicity and to avoid detracting from the invention by discussing multiple embodiments at the same time.

In device 800, according to one embodiment of the invention, well contact 813 is split off from source 808 of PFET 802 by providing a separate metallic rail contact 818 that is electrically isolated from metallic rail contact 815 of source 808. Rail contact 818 is coupled to a bias voltage: source Vnw.

According to the invention, device 800 also includes resistive path 852. According to one embodiment of the invention, resistive path 852 is partly in N+ buried well 806. N+ buried well 806 is positioned within P-bulk material 862. In one embodiment of the invention, resistive path 852 includes a horizontal distance 852A, between points 854A and 856A in N+ buried well 806, that can be varied to provide the desired resistance level.

According to one embodiment of the invention, the N+ plug that forms well tie 813 is electrically coupled to point 854A of resistive path 852 through path 854. Likewise, point 858 in N-well bulk material 811, below the channel of PFET 802, is electrically coupled to point 856A of resistive path 852 through path 856. As noted above, horizontal distance 852A separates point 854A from point 856A and, according to the invention, the value of distance 852A is predetermined to provide a resistance within a desired range.

According to the invention, it is not necessary for the resistivity to be uniform within N+ buried well 806. All that is required is that the total resistivity along resistive path 852 lie within bounds that both enable a transient floating body effect during turn-on and a return to an equilibrium potential before the next time the gate switches, as discussed in more detail above.

As also discussed above, the overall resistance between points 854A and 856A, in resistive path 852, can be varied by increasing or decreasing the horizontal distance 852A in resistive path 852. Therefore, a higher resistance can be achieved by increasing the value of 852A, or a lower resistance can be achieved by decreasing the value of 852A.

As discussed above, in the prior art CMOS devices it was specifically taught that providing a resistive path between well tie 813 and point 858 was to be avoided. As also discussed above, this teaching was adopted in light of the dual dangers of voltage drops due to large impact ionization currents and/or latch-up. However, as also discussed above, at source/drain (Vds) voltages of less than one volt, impact ionization currents drop off to insignificant levels (see FIG. 1D) and latch-up can be avoided by operating at supply voltages of less than 0.8 volt.

In addition, standard CMOS devices such as NFET 101 (FIG. 1C) require higher threshold voltages and higher threshold voltages require a higher dopant concentration which also tends to lower resistivity in the vicinity of the channel. Consequently, while it is possible to engineer a resistive path in standard CMOS, it is easier in low power or ultra-low power CMOS, because the thresholds are lower and the path resistivity is naturally higher.

In one embodiment of the invention, the structure of FIG. 8 is a low-power or ultra-low power device where the source/drain (Vds) voltages, and the supply voltages, are significantly below 0.8 volt. In one embodiment of the invention, the supply voltage operates between 0.2 volt and 0.6 volt, depending on the operating conditions resulting in source/drain voltages between 0.2 volt and 0.6 volt.

By employing the structure of FIG. 8 in a low-power or ultra-low power environment, the present invention can be utilized without fear of large impact ionization currents, and the associated voltage drops across the bulk materials 406 and 411, and without fear of latch-up or device self destruct, as was the fear in the prior art.

As seen above, in contrast to the structures and teachings of the prior art, the present invention includes a method and structure for providing low power MOS devices that include wells specifically designed to provide a resistive path between the bulk material of the device and a well tie contact. By providing a resistive path, an equivalent RC circuit is introduced to the device that allows the bulk material potential to track the gate potential, thereby advantageously lowering the threshold voltage as the device turns on and raising the threshold voltage as the device turns off. This gives the devices designed according to the invention the positive attributes of prior art partially depleted SOI devices. However, the introduction of the resistive path, in accordance with the invention, also allows the bulk material potential be controlled and stabilize at an equilibrium potential between clock periods. Therefore, devices designed according to the principles of the invention do not suffer from the floating body effect associated with prior art partially depleted SOI devices.

In addition, one embodiment of the devices according to the invention are designed to be used in a low-power or ultra-low power environment. Consequently, in contrast to prior art CMOS devices, the present invention can include resistive wells without the fear of large impact ionization current problems and/or latch-up and device self-destruct.

As a result of these and other features discussed in more detail above, devices designed according to the principles of the present invention have the desirable attributes of both prior art CMOS devices and prior art SOI devices, without the drawbacks of either of these prior art devices. Consequently, devices designed according to the principles of the invention consume less power and can better meet the needs of modern electronics markets than prior art methods or structures.

This Application is related to: U.S. Pat. No. 6,093,951, filed Jun. 30, 1997, entitled "MOS DEVICES WITH RETROGRADE POCKET REGIONS", and naming James B. Burr as inventor; U.S. patent application Ser. No. 09/028,472, filed Feb. 24, 1998, entitled "MOS DEVICE STRUCTURE AND METHOD FOR REDUCING PN JUNCTION LEAKAGE", and naming James B. Burr as inventor; U.S. patent application Ser. No. 09/095,550, filed Jun. 11, 1998, entitled "TUNABLE THRESHOLD SOI DEVICE USING BACK GATE AND INTRINSIC CHANNEL REGION", and naming James B. Burr as inventor; U.S. patent application Ser. No. 09/030,030, filed Feb. 25, 1998, entitled "BACK-BIASED MOS DEVICE AND METHOD", and naming James B. Burr and James E. Murguia as inventors; U.S. patent application Ser. No. 09/693,745, filed Oct. 18, 2000, entitled "TRANSISTOR DEVICE INCLUDING A RESISTIVE WELL" having an Attorney docket number of P-5435, and naming James B. Burr as inventor; U.S. patent application Ser. No. 09/693,715, filed Oct. 18, 2000, entitled "METHOD FOR INTRODUCING AN EQUIVALENT RC CIRCUIT IN A MOS DEVICE USING RESISTIVE WELLS", having an Attorney docket number of P-5627, and naming James B. Burr as inventor; U.S. Patent Co-filed Application Serial number 09/860,217, entitled "METHOD FOR INTRODUCING AN EQUIVALENT RC CIRCUIT IN A MOS DEVICE USING RESISTIVE PATHS", having an Attorney docket number of P-5648, and naming James B. Burr as inventor all, of which are assigned to the assignee of the present invention and are incorporated herein, in their entirety, by reference for all purposes.

The foregoing description of an implementation of the invention has been presented for purposes of illustration and description, and therefore is not exhaustive and does not limit the invention to the precise form disclosed. Modifications and variations are possible in light of the above teachings or may be acquired from practicing the invention.

For example, for simplicity, the description above is based largely on FIGS. showing NFET devices. However, those of skill in the art will readily recognize that, with minor and well-known modifications, the invention and discussion above applies equally well to PFET devices.

In addition, the discussion above is largely directed to N-well process devices, however, those of skill will recognize that the discussion above is equally applicable to P-well process devices with minor and well-known modifications.

In addition, as shown above, one aspect of the invention is to create a sufficiently resistive connection between the source of a well's potential and the electrically active bulk region proximate a transistor channel region. This is a natural consequence of distributing the well potential in a well layer, which is much more resistive than a surface metal layer. However, in another embodiment of the invention, a resistive surface layer, such as lightly doped polysilicon, could be used as well. In another embodiment, multiple resistive surface paths and/or resistive wells can be used. In one embodiment, at least one of the resistive paths and/or wells has an associated resistance that differs from the resistance associated with the other resistive paths and/or wells.

Consequently, the scope of the invention is defined by the claims and their equivalents.

What is claimed is:

1. A device comprising:
   a substrate having a first dopant concentration of a first conductivity type;
   an epitaxial layer formed on said substrate, said epitaxial layer having a second dopant concentration of said first conductivity type;
   source and drain regions positioned within said epitaxial layer and separated by a channel region, said source and drain regions having a second conductivity type;
   a gate positioned over said channel region; and
   a resistive path, said resistive path being positioned in said epitaxial layer and said substrate so as to couple a first location in said epitaxial layer, below said channel region, to a second location in said epitaxial layer, said resistive path having a horizontal length in said substrate, wherein;
   said horizontal length of said resistive path is chosen to provide a resistance between said first location and said second location in said epitaxial layer within a specific range of resistance values.

2. The device of claim 1, wherein;
   said first dopant concentration is greater than said second dopant concentration.

3. The device of claim 2, further comprising:
   a well tie of said first conductivity type positioned within said epitaxial layer, said well tie being positioned beside one of said source or drain regions and outside said channel region, wherein;
   said well tie is electrically coupled to said second location in said epitaxial layer.

4. The device of claim 3, wherein;
   said well tie is coupled to a first supply voltage and said source is coupled to a second supply voltage.

5. The device of claim 4, wherein;
   said device is characterized as having an on current and an off current and the ratio of on current to off current in said device is not greater than about $10^5$.

6. The device of claim 4, wherein;
   said device has an unbiased threshold voltage of between about −150 millivolts and +150 millivolts.

7. A device comprising:
   a substrate having a first dopant concentration of a first conductivity type;
   an epitaxial layer formed on said substrate, said epitaxial layer having a second dopant concentration of said first conductivity type;
   source and drain regions positioned within said epitaxial layer and separated by a channel region, said source and drain regions having a second conductivity type;
   a gate positioned over said channel region;
   a resistive path, said resistive path being positioned in said epitaxial layer and said substrate so as to couple a first location in said epitaxial layer, below said channel region, to a second location in said epitaxial layer, said resistive path having a horizontal length in said substrate; and
   a well tie of said first conductivity type positioned within said epitaxial layer, said well tie being positioned beside one of said source or drain regions and outside said channel region, said well tie being electrically coupled to said second location in said epitaxial layer, said well tie being coupled to a first supply voltage, wherein;
   said horizontal length of said resistive path is chosen to provide a resistance between said first location and said second location in said epitaxial layer within a specific range of resistance values, further wherein;
   said device is characterized as having an on current and an off current and the ratio of on current to off current in said device is not greater than about $10^5$, further wherein;
   said device has an unbiased threshold voltage of between about −150 millivolts and +150 millivolts.

* * * * *